(12) United States Patent
Yamazaki et al.

(10) Patent No.: US 9,828,296 B2
(45) Date of Patent: Nov. 28, 2017

(54) LEAD-FREE PIEZOELECTRIC CERAMIC COMPOSITION, METHOD FOR PRODUCING SAME, PIEZOELECTRIC ELEMENT USING LEAD-FREE PIEZOELECTRIC CERAMIC COMPOSITION, ULTRASONIC PROCESSING MACHINE, ULTRASONIC DRIVE DEVICE, AND SENSING DEVICE

(75) Inventors: Masato Yamazaki, Komaki (JP); Takayuki Matsuoka, Aichi (JP); Kazuaki Kitamura, Ise (JP); Hideto Yamada, Komaki (JP); Toshiaki Kurahashi, Kounan (JP); Katsuya Yamagiwa, Komaki (JP); Kazushige Ohbayashi, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 421 days.

(21) Appl. No.: 14/232,146

(22) PCT Filed: Jul. 4, 2012

(86) PCT No.: PCT/JP2012/004329
§ 371 (c)(1),
(2), (4) Date: Jan. 10, 2014

(87) PCT Pub. No.: WO2013/008418
PCT Pub. Date: Jan. 17, 2013

(65) Prior Publication Data
US 2014/0139070 A1    May 22, 2014

(30) Foreign Application Priority Data
Jul. 13, 2011 (JP) .................................. 2011-154430

(51) Int. Cl.
*H01L 41/187* (2006.01)
*C04B 35/64* (2006.01)
(Continued)

(52) U.S. Cl.
CPC ............. *C04B 35/64* (2013.01); *B06B 1/0618* (2013.01); *C04B 35/495* (2013.01);
(Continued)

(58) Field of Classification Search
CPC ....... H01L 41/187; H01L 41/18; C04B 35/64; C04B 35/495; C04B 35/62685; B06B 1/0618
(Continued)

(56) References Cited

U.S. PATENT DOCUMENTS 5,607,632 A * 3/1997 Neurgaonkar ........ C04B 35/491
264/122
6,387,295 B1    5/2002 Saito
(Continued)

FOREIGN PATENT DOCUMENTS

EP    2 530 060 A1    12/2012
JP    2000313664 A    11/2000
(Continued)

OTHER PUBLICATIONS

Ahn, et al., "Structural Variation and Piezoelectric Properties of 0.95 $(Na_{0.5}K_{0.5})NbO_3$-$0.05BaTiO_3$ Ceramics", Sensors and Actuators, Nov. 22, 2006, vol. 136, Issue 1, pp. 255-260.
(Continued)

*Primary Examiner* — Bryan Gordon
(74) *Attorney, Agent, or Firm* — Sughrue Mion, PLLC

(57) ABSTRACT

A lead-free piezoelectric ceramic composition mainly includes a first crystal phase (KNN phase) and a second crystal phase (NTK phase). In the first crystal phase (KNN phase), a plurality of crystal grains formed of an alkali
(Continued)

niobate/tantalate perovskite oxide having piezoelectric characteristics is bound to each other in a deposited state. The second crystal phase (NTK phase) is formed of a compound containing titanium (Ti) and fills spaces between the crystal grains in the first crystal phase.

14 Claims, 24 Drawing Sheets

(51) Int. Cl.
*C04B 35/495* (2006.01)
*C04B 35/626* (2006.01)
*G01L 23/22* (2006.01)
*B06B 1/06* (2006.01)
*H01L 41/43* (2013.01)

(52) U.S. Cl.
CPC ...... *C04B 35/62685* (2013.01); *G01L 23/222* (2013.01); *H01L 41/1873* (2013.01); *H01L 41/43* (2013.01); *C04B 2235/3201* (2013.01); *C04B 2235/3203* (2013.01); *C04B 2235/3208* (2013.01); *C04B 2235/3213* (2013.01); *C04B 2235/3215* (2013.01); *C04B 2235/3224* (2013.01); *C04B 2235/3234* (2013.01); *C04B 2235/3244* (2013.01); *C04B 2235/3251* (2013.01); *C04B 2235/3267* (2013.01); *C04B 2235/3272* (2013.01); *C04B 2235/3275* (2013.01); *C04B 2235/3279* (2013.01); *C04B 2235/3281* (2013.01); *C04B 2235/3284* (2013.01); *C04B 2235/3291* (2013.01); *C04B 2235/3298* (2013.01); *C04B 2235/768* (2013.01); *C04B 2235/79* (2013.01); *C04B 2235/80* (2013.01)

(58) Field of Classification Search
USPC .................................. 310/358; 252/62.9 PZ
See application file for complete search history.

(56) References Cited

U.S. PATENT DOCUMENTS

| | | | |
|---|---|---|---|
| 2003/0071240 A1 | 4/2003 | Kimura et al. | |
| 2003/0178605 A1 | 9/2003 | Nonoyama et al. | |
| 2004/0214723 A1* | 10/2004 | Nonoyama | C01G 33/006 505/100 |
| 2006/0006360 A1* | 1/2006 | Takao | C04B 35/495 252/62.9 R |
| 2008/0305944 A1* | 12/2008 | Ueda | C01G 25/006 501/137 |
| 2010/0219724 A1* | 9/2010 | Schossmann | C04B 35/491 310/365 |
| 2012/0146462 A1 | 6/2012 | Yamazaki et al. | |

FOREIGN PATENT DOCUMENTS

| | | |
|---|---|---|
| JP | 2001-240471 A | 9/2001 |
| JP | 2003342069 A | 12/2003 |
| JP | 2004002051 A | 1/2004 |
| JP | 2008174424 A | 7/2008 |
| WO | 2011093021 A1 | 8/2011 |

OTHER PUBLICATIONS

Office Action dated Apr. 15, 2014, issued by the Japanese Patent Office in counterpart Japanese Application No. 2012-549192.
Search Report dated Jan. 26, 2015 issued by the European Patent Office in counterpart European Patent Application No. 12811521.9.
Darko Makovec et al.; "$TiO_2$ as a sintering additive for $KNbO_3$ ceramics"; Ceramics International; ScienceDirect; vol. 34; No. 1; 2008; pp. 89-94; XP022318852.
Hwi-Yeol Park et al.; "Microstructure and piezoelectric properties of lead-free $(1-x)(Na_{0.5}K_{0.5})NbO_3$-$xCaTiO_3$ ceramics"; Journal of Applied Physics; American Institute of Physics; vol. 102; No. 12; Dec. 17, 2007; 6 pages total; XP012105224.
Seo, et al.; "Effect of CuO on the Sintering and Piezoelectric Properties of 0.95 $(Na_{0.5}K_{0.5})NbO_3$-$0.5SrTiO_3$ Lead-Free Piezoelectric Ceramics"; J. Am. Chem; vol. 91 No. 12; 2008; pp. 3955-3960.
International Search Report (PCT/ISA/210) issued in International Application No. PCT/JP2012/004329; Sep. 18, 2012.
Written Opinion (PCT/ISA/237) issued in International Application No. PCT/JP2012/004329; Sep. 18, 2012.

* cited by examiner

FIG. 7

| Sample | First crystal phase (mother phase) | | | | | | | | | Second crystal phase (subphase) | | | Subphase content (mol%) | Relative permittivity $\varepsilon_{33}T/\varepsilon_0$ | Piezoelectric constant $d_{33}$ (pC/N) | Electromechanical coupling coefficient Kr |
|---|---|---|---|---|---|---|---|---|---|---|---|---|---|---|---|---|
| | Element E | Element D | a | b | c | d | e | f | | Element A | Element B | x | | | | |
| S01 | - | - | - | - | - | - | - | - | | K | Nb | 0 | 100 | 500 | - | - |
| S02 | - | - | - | - | - | - | - | - | | K | Nb | 0.15 | 100 | 500 | - | - |
| S03 | - | Nb | 0.500 | 0.500 | 0 | 0 | 1.00 | 3.00 | | - | - | - | 0 | 430 | 90 | 0.30 |
| S04 | - | Nb | 0.490 | 0.490 | 0.020 | 0 | 1.00 | 3.00 | | - | - | - | 0 | 430 | 95 | 0.31 |
| S05 | - | Nb | 0.490 | 0.490 | 0.020 | 0 | 1.00 | 3.00 | | K | Nb | 0 | 5 | 1080 | 154 | 0.36 |
| S06 | Ca | Nb | 0.421 | 0.518 | 0.022 | 0.039 | 1.07 | 3.06 | | K | Nb | 0.15 | 3 | 1100 | 120 | 0.30 |
| S07 | Ca | Nb | 0.421 | 0.518 | 0.022 | 0.039 | 1.07 | 3.06 | | K | Nb | 0.15 | 4 | 1110 | 164 | 0.32 |
| S08 | Ca | Nb | 0.421 | 0.518 | 0.022 | 0.039 | 1.07 | 3.06 | | K | Nb | 0.15 | 5 | 1130 | 170 | 0.43 |
| S09 | Ca | Nb | 0.421 | 0.518 | 0.022 | 0.039 | 1.07 | 3.06 | | K | Nb | 0.15 | 6 | 1050 | 163 | 0.35 |
| S10 | Ca | Nb | 0.421 | 0.518 | 0.022 | 0.039 | 1.07 | 3.06 | | K | Nb | 0.15 | 10 | 1000 | 120 | 0.31 |
| S11 | Ca | Nb | 0.421 | 0.518 | 0.022 | 0.039 | 1.07 | 3.06 | | K | Nb | 0.15 | 15 | 950 | 105 | 0.30 |
| S12 | Ca | Nb | 0.421 | 0.518 | 0.022 | 0.039 | 1.07 | 3.06 | | K | Nb | 0.15 | 20 | 900 | 60 | 0.20 |
| S13 | Ca | Nb | 0.455 | 0.474 | 0.022 | 0.049 | 1.07 | 3.06 | | K | Ta | 0 | 5 | 1250 | 153 | 0.35 |
| S14 | Ca | Nb | 0.455 | 0.474 | 0.022 | 0.049 | 1.07 | 3.06 | | K | Nb | 0.15 | 5 | 1200 | 155 | 0.38 |
| S15 | Ca, Sr | Nb | 0.420 | 0.519 | 0.022 | 0.039 | 1.07 | 3.06 | | K | Nb | 0 | 5 | 920 | 120 | 0.31 |

First crystal phase (mother phase): $(K_a Na_b Li_c E_d)_e DO_f$
(E is at least one of Ca, Sr, and Ba; D is at least one of Nb and Ta; a+b+c+d=1; e is any value; f is any value that forms a perovskite)

Second crystal phase (subphase): $A_{1-x} Ti_{1-x} B_{1+x} O_5$
(A is at least one alkali metal; B is at least one of Nb and Ta; x is any value)

FIG. 9

| Sample | First crystal phase (mother phase) | | | | | | | | Second crystal phase (subphase) | | | Subphase content (mol%) | Curie point Tc (°C) | Phase transition at room temperature |
|---|---|---|---|---|---|---|---|---|---|---|---|---|---|---|
| | Element E | Element D | a | b | c | d | e | f | Element A | Element B | x | | | |
| S01 | - | - | - | - | - | - | - | - | K | Nb | 0 | 100 | - | - |
| S02 | - | - | - | - | - | - | - | - | K | Nb | 0.15 | 100 | - | - |
| S03 | - | Nb | 0.500 | 0.500 | 0 | 0 | 1.00 | 3.00 | - | - | - | 0 | 400 | Present |
| S04 | - | Nb | 0.490 | 0.490 | 0.020 | 0 | 1.00 | 3.00 | - | - | - | 0 | 410 | Present |
| S05 | - | Nb | 0.490 | 0.490 | 0.020 | 0 | 1.00 | 3.00 | K | Nb | 0 | 5 | 340 | Absent |
| S06 | Ca | Nb | 0.421 | 0.518 | 0.022 | 0.039 | 1.07 | 3.06 | K | Nb | 0.15 | 3 | 350 | Absent |
| S07 | Ca | Nb | 0.421 | 0.518 | 0.022 | 0.039 | 1.07 | 3.06 | K | Nb | 0.15 | 4 | 350 | Absent |
| S08 | Ca | Nb | 0.421 | 0.518 | 0.022 | 0.039 | 1.07 | 3.06 | K | Nb | 0.15 | 5 | 350 | Absent |
| S09 | Ca | Nb | 0.421 | 0.518 | 0.022 | 0.039 | 1.07 | 3.06 | K | Nb | 0.15 | 6 | 350 | Absent |
| S10 | Ca | Nb | 0.421 | 0.518 | 0.022 | 0.039 | 1.07 | 3.06 | K | Nb | 0.15 | 10 | 350 | Absent |
| S11 | Ca | Nb | 0.421 | 0.518 | 0.022 | 0.039 | 1.07 | 3.06 | K | Nb | 0.15 | 15 | 350 | Absent |
| S12 | Ca | Nb | 0.421 | 0.518 | 0.022 | 0.039 | 1.07 | 3.06 | K | Nb | 0.15 | 20 | 350 | Absent |
| S13 | Ca | Nb | 0.455 | 0.474 | 0.022 | 0.049 | 1.07 | 3.06 | K | Ta | 0 | 5 | 300 | Absent |
| S14 | Ca | Nb | 0.455 | 0.474 | 0.022 | 0.049 | 1.07 | 3.06 | K | Nb | 0.15 | 5 | 350 | Absent |
| S15 | Ca, Sr | Nb | 0.420 | 0.519 | 0.022 | 0.039 | 1.07 | 3.06 | K | Nb | 0 | 5 | 340 | Absent |

First crystal phase (mother phase): $(K_aNa_bLi_cE_d)_eDO_f$
(E is at least one of Ca, Sr, and Ba; D is at least one of Nb and Ta; $a+b+c+d=1$; e is any value; f is any value that forms a perovskite)

Second crystal phase (subphase): $A_{1-x}Ti_{1-x}B_{1+x}O_5$
(A is at least one alkali metal; B is at least one of Nb and Ta; x is any value)

FIG. 10

| Sample | First crystal phase (mother phase) | | | | | | Second crystal phase (subphase) | | | Subphase content (mol%) | Relative permittivity $\varepsilon_{33}T/\varepsilon_0$ | Piezoelectric constant $d_{33}$ (pC/N) | Electromechanical coupling coefficient Kr |
|---|---|---|---|---|---|---|---|---|---|---|---|---|---|
| | a | b | c | d | e | f | Element A | Element B | x | | | | |
| S04 | 0.490 | 0.490 | 0.020 | 0 | 1.00 | 3.00 | - | - | - | 0 | 430 | 95 | 0.31 |
| S21 | 0.455 | 0.474 | 0.022 | 0.049 | 0.970 | 3.01 | K | Nb | 0 | 5 | 880 | 105 | 0.29 |
| S22 | 0.455 | 0.474 | 0.022 | 0.049 | 1.000 | 3.02 | K | Nb | 0.15 | 5 | 1040 | 139 | 0.36 |
| S23 | 0.455 | 0.474 | 0.022 | 0.049 | 1.035 | 3.04 | K | Nb | 0.15 | 5 | 1110 | 157 | 0.40 |
| S24 | 0.455 | 0.474 | 0.022 | 0.049 | 1.049 | 3.05 | K | Nb | 0.15 | 5 | 1060 | 167 | 0.42 |
| S25 (S14) | 0.455 | 0.474 | 0.022 | 0.049 | 1.070 | 3.06 | K | Nb | 0.15 | 5 | 1200 | 155 | 0.38 |
| S26 | 0.455 | 0.474 | 0.022 | 0.049 | 1.089 | 3.07 | K | Nb | 0.15 | 5 | 1100 | 47 | 0.12 |
| S27 | 0.455 | 0.474 | 0.022 | 0.049 | 1.100 | 3.08 | K | Nb | 0.15 | 5 | 1090 | 45 | 0.12 |

First crystal phase (mother phase): $(K_aNa_bLi_cCa_d)_eNbO_f$
(a+b+c+d=1; e is any value; f is any value that forms a perovskite)

Second crystal phase (subphase): $A_{1-x}Ti_{1-x}B_{1+x}O_5$
(A is at least one alkali metal; B is at least one of Nb and Ta; x is any value)

FIG. 12

| Sample | First crystal phase (mother phase) | | | | | | Second crystal phase (subphase) | | | | Subphase content (mol%) | Additional metal | | Relative permittivity $\varepsilon_{33}T/\varepsilon_0$ | Piezo-electric constant $d_{33}$ (pC/N) | Electro-mechanical coupling coefficient Kr |
|---|---|---|---|---|---|---|---|---|---|---|---|---|---|---|---|---|
| | a | b | c | d | e | f | Element A | Element B | x | | metal | mol% | | | |
| S04 | 0.490 | 0.490 | 0.020 | 0 | 1.00 | 3.00 | - | - | - | 0 | - | 0 | 430 | 95 | 0.31 |
| S31 | 0.500 | 0.500 | 0 | 0 | 1.000 | 3.00 | - | - | - | 0 | Cu | 1 | 235 | 95 | 0.37 |
| S32 (S08) | 0.421 | 0.518 | 0.022 | 0.039 | 1.070 | 3.06 | K | Nb | 0.15 | 5 | - | 0 | 1130 | 170 | 0.43 |
| S33 | 0.455 | 0.484 | 0.022 | 0.039 | 1.070 | 3.06 | K | Nb | 0.15 | 5 | Cu | 0.5 | 1050 | 186 | 0.46 |
| S34 | 0.455 | 0.484 | 0.022 | 0.039 | 1.070 | 3.06 | K | Nb | 0.15 | 5 | Cu | 1 | 985 | 138 | 0.38 |
| S35 | 0.455 | 0.484 | 0.022 | 0.039 | 1.070 | 3.06 | K | Nb | 0.15 | 5 | Cu, Fe | 0.5, 0.5 | 1042 | 200 | 0.48 |
| S36 | 0.464 | 0.474 | 0.022 | 0.039 | 1.070 | 3.06 | K | Nb | 0.15 | 5 | Fe | 0.5 | 1119 | 199 | 0.48 |
| S37 | 0.464 | 0.474 | 0.022 | 0.039 | 1.070 | 3.06 | K | Nb | 0.15 | 5 | Cu, Ni | 0.5, 0.5 | 1150 | 170 | 0.44 |
| S38 | 0.464 | 0.474 | 0.022 | 0.039 | 1.070 | 3.06 | K | Nb | 0.15 | 5 | Ag | 0.5 | 1060 | 171 | 0.42 |
| S39 | 0.464 | 0.474 | 0.022 | 0.039 | 1.070 | 3.06 | K | Nb | 0.15 | 5 | Zr | 0.5 | 1121 | 166 | 0.42 |
| S40 | 0.464 | 0.474 | 0.022 | 0.039 | 1.070 | 3.06 | K | Nb | 0.15 | 5 | Zn | 0.5 | 1221 | 175 | 0.42 |
| S41 | 0.464 | 0.474 | 0.022 | 0.039 | 1.070 | 3.06 | K | Nb | 0.15 | 5 | Sc, Bi | 0.5, 0.5 | 1213 | 172 | 0.41 |
| S42 | 0.464 | 0.474 | 0.022 | 0.039 | 1.070 | 3.06 | K | Nb | 0.15 | 5 | Mn | 0.5 | 976 | 156 | 0.42 |
| S43 | 0.455 | 0.474 | 0.022 | 0.049 | 1.070 | 3.06 | K | Nb | 0.15 | 5 | Co | 0.5 | 1080 | 180 | 0.45 |

First crystal phase (mother phase): $(K_a Na_b Li_c Ca_d)_e NbO_f$
($a+b+c+d=1$; e is any value; f is any value that forms a perovskite)

Second crystal phase (subphase): $A_{1-x} Ti_{1-x} B_{1+x} O_5$
(A is at least one alkali metal; B is at least one of Nb and Ta; x is any value)

*FIG. 13*

| Sample | First crystal phase (mother phase) | | | | | | Second crystal phase (subphase) | | | Subphase content (mol%) | Additional metal | | Allowable voltage (kV/mm) |
|---|---|---|---|---|---|---|---|---|---|---|---|---|---|
| | a | b | c | d | e | f | Element A | Element B | x | | metal | mol% | |
| S03 | 0.500 | 0.500 | 0 | 0 | 1.00 | 3.00 | - | - | - | 0 | - | 0 | 3 |
| S04 | 0.490 | 0.490 | 0.020 | 0 | 1.00 | 3.00 | - | - | - | 0 | - | 0 | 3 |
| S08 | 0.421 | 0.518 | 0.022 | 0.039 | 1.070 | 3.06 | K | Nb | 0.15 | 5 | - | 0 | 7 |
| S035 | 0.455 | 0.484 | 0.022 | 0.039 | 1.070 | 3.06 | K | Nb | 0.15 | 5 | Cu, Fe | 0.5, 0.5 | 9 |

First crystal phase (mother phase): $(K_a Na_b Li_c Ca_d)_e NbO_f$
($a+b+c+d=1$; e is any value; f is any value that forms a perovskite)

Second crystal phase (subphase): $A_{1-x} Ti_{1-x} B_{1+x} O_5$
(A is at least one alkali metal; B is at least one of Nb and Ta; x is any value)

FIG. 14

Second crystal phase mixed as $KTiNbO_5$ phase

| Sample | First crystal phase (mother phase) | | | | | | Subphase content (mol%) | Additional metal | | NTK phase (XRD analysis) | NTK phase (TEM-EDS) |
|---|---|---|---|---|---|---|---|---|---|---|---|
| | a | b | c | d | e | f | | metal | mol% | | |
| S06 (Fig. 7) | 0.421 | 0.518 | 0.022 | 0.039 | 1.070 | 3.06 | 3 | - | 0 | - | 1115 |
| S08 (Fig. 7) | 0.421 | 0.518 | 0.022 | 0.039 | 1.070 | 3.06 | 5 | - | 0 | 1115 | 1115 |
| S10 (Fig. 7) | 0.421 | 0.518 | 0.022 | 0.039 | 1.070 | 3.06 | 10 | - | 0 | 1115 | 1115 |
| S12 (Fig. 7) | 0.421 | 0.518 | 0.022 | 0.039 | 1.070 | 3.06 | 20 | - | 0 | 1115 | 1115 |
| S33 (Fig. 12) | 0.455 | 0.484 | 0.022 | 0.039 | 1.070 | 3.06 | 5 | Cu | 0.5 | - | 1115 |
| S35 (Fig. 12) | 0.455 | 0.484 | 0.022 | 0.039 | 1.070 | 3.06 | 5 | Cu, Fe | 0.5, 0.5 | 1319 | 1319 |
| S36 (Fig. 12) | 0.464 | 0.474 | 0.022 | 0.039 | 1.070 | 3.06 | 5 | Fe | 0.5 | 1319 | 1319 |
| S40 (Fig. 12) | 0.464 | 0.474 | 0.022 | 0.039 | 1.070 | 3.06 | 5 | Zn | 0.5 | 1115 | 1115 |
| S42 (Fig. 12) | 0.464 | 0.474 | 0.022 | 0.039 | 1.070 | 3.06 | 5 | Mn | 0.5 | 1115, 1319 | 1115, 1319 |

First crystal phase (mother phase): $(K_a Na_b Li_c Ca_d)_e NbO_f$.
(a+b+c+d=1; e is any value; f is any value that forms a perovskite)

Second crystal phase (subphase):
  NTK phase: 1115   $KTiNbO_5$ phase
  NTK phase: 1319   $KTi_3NbO_9$ phase

FIG. 15

Second crystal phase mixed as $KTi_3NbO_9$ phase

| Sample | First crystal phase (mother phase) | | | | | | Subphase content (mol%) | Additional metal | | NTK phase (XRD analysis) | NTK phase (TEM-EDS) |
|---|---|---|---|---|---|---|---|---|---|---|---|
| | a | b | c | d | e | f | | metal | mol% | | |
| S51 | 0.421 | 0.518 | 0.022 | 0.039 | 1.070 | 3.06 | 3 | - | 0 | - | 1319 |
| S52 | 0.421 | 0.518 | 0.022 | 0.039 | 1.070 | 3.06 | 5 | - | 0 | 1319 | 1319 |
| S53 | 0.455 | 0.484 | 0.022 | 0.039 | 1.070 | 3.06 | 5 | Cu | 0.5 | - | 1319 |
| S54 | 0.455 | 0.484 | 0.022 | 0.039 | 1.070 | 3.06 | 5 | Cu, Fe | 0.5, 0.5 | 1319 | 1319 |
| S55 | 0.421 | 0.518 | 0.022 | 0.039 | 1.070 | 3.06 | 5 | Fe | 0.5 | 1319 | 1319 |
| S56 | 0.421 | 0.508 | 0.022 | 0.049 | 1.070 | 3.07 | 5 | Zn | 0.5 | 1319 | 1319 |
| S57 | 0.416 | 0.503 | 0.033 | 0.049 | 1.080 | 3.07 | 5 | Mn | 0.5 | 1319 | 1319 |

First crystal phase (mother phase): $(K_aNa_bLi_cCa_d)_eNbO_f$
($a+b+c+d=1$; e is any value; f is any value that forms a perovskite)

Second crystal phase (subphase):
NTK phase: 1115    $KTiNbO_5$ phase
NTK phase: 1319    $KTi_3NbO_9$ phase

*FIG. 16*

| Sample | First crystal phase (mother phase) Elements E1, E2 | a | b | c | d1 | d2 | e | f | Subphase content (mol%) | Additional metal Metal | Additional metal mol% | Relative permittivity ε₃ᵀ/ε₀ | Piezoelectric constant $d_{33}$ (pC/N) | Electromechanical coupling coefficient $k_r$ |
|---|---|---|---|---|---|---|---|---|---|---|---|---|---|---|
| S04 (Fig 12) | - | 0.490 | 0.490 | 0.020 | 0 | 0 | 1.00 | 3.00 | 0 | - | 0 | 430 | 95 | 0.31 |
| S31 (Fig 12) | - | 0.500 | 0.500 | 0.000 | 0 | 0 | 1.00 | 3.00 | 0 | Cu | 1 | 235 | 95 | 0.37 |
| S61 | Ca, Ba | 0.449 | 0.478 | 0.022 | 0.039 | 0.011 | 1.08 | 3.07 | 5 | Zr | 1 | 1207 | 189 | 0.42 |
| S62 | Ca, Ba | 0.449 | 0.478 | 0.022 | 0.039 | 0.011 | 1.08 | 3.07 | 5 | Cu, Zr | 0.5, 1 | 1370 | 224 | 0.50 |
| S63 | Ca, Ba | 0.449 | 0.478 | 0.022 | 0.039 | 0.011 | 1.08 | 3.07 | 5 | Fe, Zr | 0.5, 1 | 1405 | 185 | 0.42 |
| S64 | Ca, Ba | 0.449 | 0.478 | 0.022 | 0.039 | 0.011 | 1.08 | 3.07 | 5 | Zn, Zr | 0.5, 1 | 1414 | 203 | 0.46 |
| S65 | Ca, Ba | 0.449 | 0.478 | 0.022 | 0.039 | 0.011 | 1.08 | 3.07 | 5 | Cu, Fe, Zr | 0.5, 0.5, 1 | 1480 | 234 | 0.52 |
| S66 | Ca, Ba | 0.449 | 0.478 | 0.022 | 0.039 | 0.011 | 1.08 | 3.07 | 5 | Cu, Fe, Zr | 0.6, 0.3, 1 | 1502 | 243 | 0.52 |
| S67 | Ca, Ba | 0.449 | 0.478 | 0.022 | 0.039 | 0.011 | 1.08 | 3.07 | 5 | Fe, Zn, Zr | 0.5, 0.5, 1 | 1445 | 205 | 0.47 |
| S68 | Ca, Ba | 0.449 | 0.478 | 0.022 | 0.039 | 0.011 | 1.08 | 3.07 | 5 | Cu, Fe, Zn, Zr | 0.5, 0.5, 0.5, 1 | 1550 | 253 | 0.51 |
| S69 | Ca | 0.449 | 0.478 | 0.022 | 0.050 | 0 | 1.08 | 3.07 | 5 | Cu, Fe, Zr | 0.5, 0.5, 1 | 1390 | 217 | 0.48 |
| S70 | Ca, Sr | 0.449 | 0.478 | 0.022 | 0.039 | 0.011 | 1.08 | 3.07 | 5 | Cu, Fe, Zr | 0.5, 0.5, 1 | 1278 | 211 | 0.47 |
| S71 | Ca, Ba | 0.396 | 0.532 | 0.022 | 0.039 | 0.011 | 1.08 | 3.07 | 5 | Cu, Fe, Zr | 0.5, 0.5, 1 | 1317 | 205 | 0.46 |
| S72 | Ca | 0.396 | 0.532 | 0.022 | 0.050 | 0 | 1.08 | 3.07 | 5 | Ni, Cu, Zr | 0.5, 0.5, 1 | 1329 | 189 | 0.43 |
| S73 | Ca, Sr | 0.396 | 0.532 | 0.022 | 0.039 | 0.011 | 1.08 | 3.07 | 5 | Ni, Cu, Zr | 0.5, 0.5, 1 | 1285 | 183 | 0.41 |
| S74 | Ca, Ba | 0.449 | 0.478 | 0.022 | 0.039 | 0.012 | 0.98 | 3.01 | 5 | Cu, Fe, Zr | 0.5, 0.5, 1 | 904 | 83 | 0.24 |
| S75 | Ca, Ba | 0.449 | 0.478 | 0.022 | 0.039 | 0.012 | 1.047 | 3.05 | 5 | Cu, Fe, Zr | 0.5, 0.5, 1 | 988 | 121 | 0.33 |
| S76 | Ca | 0.396 | 0.537 | 0.022 | 0.045 | 0 | 1.08 | 3.06 | 5 | Ni, Cu, Zr | 0.5, 0.5, 1 | 1070 | 142 | 0.37 |
| S77 | Ca, Sr | 0.396 | 0.537 | 0.022 | 0.034 | 0.011 | 0.98 | 3.01 | 5 | Ni, Cu, Zr | 0.5, 0.5, 1 | 1300 | 195 | 0.45 |
| S78 | Ca, Ba | 0.449 | 0.478 | 0.022 | 0.039 | 0.011 | 1.09 | 3.07 | 5 | Cu, Fe, Zn, Zr | 0.5, 0.5, 0.5, 1 | 1360 | 174 | 0.39 |
| S79 | Ca, Ba | 0.449 | 0.478 | 0.022 | 0.039 | 0.011 | 1.12 | 3.09 | 5 | Cu, Fe, Zn, Zr | 0.5, 0.5, 0.5, 1 | 1500 | 205 | 0.41 |
| S80 | Ca, Ba | 0.449 | 0.478 | 0.022 | 0.039 | 0.011 | 1.08 | 3.07 | 5 | Cu, Fe, Zn, Zr | 0.5, 0.5, 0.5, 1 | | Not densified | |
| S81 | Ca, Ba | 0.449 | 0.478 | 0.022 | 0.039 | 0.011 | 1.08 | 3.07 | 0 | - | 0 | | Not densified | |

First crystal phase (mother phase): $(K_a Na_b Li_c E1_{d1} E2_{d2})_e NbO_f$
(E1 and E2 are at least one of Ca, Sr, and Ba; $a+b+c+d1+d2=1$; e is any value; f is any value that forms a perovskite)
Second crystal phase (subphase): $K_{0.85} Ti_{0.85} Nb_{1.15} O_5$

FIG. 17

Results of thermal cycle evaluation test

| Sample | First crystal phase (mother phase) | | | | | | | Subphase content (mol%) | Additional metal | | Electromechanical coupling coefficient Kr | | |
|---|---|---|---|---|---|---|---|---|---|---|---|---|---|
| | Elements E1, E2 | a | b | c | d1 | d2 | e | f | | Metal | mol% | Initial value | After thermal cycle | Drop rate (%) |
| S04 (Fig. 12) | - | 0.490 | 0.490 | 0.020 | 0 | 0 | 1.00 | 3.00 | 0 | - | 0 | 0.31 | 0.10 | -67.7 |
| S31 (Fig. 12) | - | 0.500 | 0.500 | 0 | 0 | 0 | 1.00 | 3.00 | 0 | Cu | 1 | 0.37 | 0.12 | -67.6 |
| S32 (Fig. 12) | Ca | 0.421 | 0.518 | 0.022 | 0.039 | 0 | 1.07 | 3.06 | 5 | - | 0 | 0.43 | 0.32 | -25.6 |
| S61 (Fig. 16) | Ca, Ba | 0.449 | 0.478 | 0.022 | 0.039 | 0.011 | 1.08 | 3.07 | 5 | Zr | 1 | 0.42 | 0.32 | -23.8 |
| S62 (Fig. 16) | Ca, Ba | 0.449 | 0.478 | 0.022 | 0.039 | 0.011 | 1.08 | 3.07 | 5 | Cu, Zr | 0.5, 1 | 0.50 | 0.40 | -20.0 |
| S63 (Fig. 16) | Ca, Ba | 0.449 | 0.478 | 0.022 | 0.039 | 0.011 | 1.08 | 3.07 | 5 | Fe, Zr | 0.5, 1 | 0.42 | 0.36 | -14.3 |
| S64 (Fig. 16) | Ca, Ba | 0.449 | 0.478 | 0.022 | 0.039 | 0.011 | 1.08 | 3.07 | 5 | Zn, Zr | 0.5, 1 | 0.46 | 0.34 | -26.1 |
| S65 (Fig. 16) | Ca, Ba | 0.449 | 0.478 | 0.022 | 0.039 | 0.011 | 1.08 | 3.07 | 5 | Cu, Fe, Zr | 0.5, 0.5, 1 | 0.52 | 0.44 | -15.4 |
| S67 (Fig. 16) | Ca, Ba | 0.449 | 0.478 | 0.022 | 0.039 | 0.011 | 1.08 | 3.07 | 5 | Fe, Zn, Zr | 0.5, 0.5, 1 | 0.47 | 0.37 | -21.3 |
| S68 (Fig. 16) | Ca, Ba | 0.449 | 0.478 | 0.022 | 0.039 | 0.011 | 1.08 | 3.07 | 5 | Cu, Fe, Zn, Zr | 0.5, 0.5, 0.5, 1 | 0.51 | 0.45 | -11.8 |
| S69 (Fig. 16) | Ca | 0.449 | 0.478 | 0.022 | 0.050 | 0 | 1.08 | 3.07 | 5 | Cu, Fe, Zr | 0.5, 0.5, 1 | 0.48 | 0.43 | -10.4 |

First crystal phase (mother phase): $(K_a Na_b Li_c E1_{d1} E2_{d2})_e NbO_f$
(E1 and E2 are at least one of Ca, Sr, and Ba; $a+b+c+d1+d2=1$; e is any value; f is any value that forms a perovskite)

Second crystal phase (subphase): $K_{0.85} Ti_{0.85} Nb_{1.15} O_5$

FIG. 18

| Sample | First crystal phase (mother phase) | | | | | | | Subphase content (mol%) | Additional metal | | Relative permittivity $\varepsilon_{33}T/\varepsilon_0$ | Piezo-electric constant $d_{33}$ (pC/N) | Electro-mechanical coupling coefficient Kr | Porosity vol% | Dielectric breakdown voltage kV/mm |
|---|---|---|---|---|---|---|---|---|---|---|---|---|---|---|---|
| | Elements E1, E2 | a | b | c | d1 | d2 | e | f | | Metal | mol% | | | | | |
| S90 | Ca, Ba | 0.449 | 0.478 | 0.022 | 0.039 | 0.011 | 1.08 | 3.07 | 1 | Cu, Fe, Zn, Zr | 0.5, 0.5, 0.5, 1 | 1150 | 105 | 0.36 | 1 | 6 |
| S91 | Ca, Ba | 0.449 | 0.478 | 0.022 | 0.039 | 0.011 | 1.08 | 3.07 | 2 | Cu, Fe, Zn, Zr | 0.5, 0.5, 0.5, 1 | 1200 | 160 | 0.38 | 0.5 | 7 |
| S92 | Ca, Ba | 0.449 | 0.478 | 0.022 | 0.039 | 0.011 | 1.08 | 3.07 | 4 | Cu, Fe, Zn, Zr | 0.5, 0.5, 0.5, 1 | 1500 | 233 | 0.49 | 0 | 9 |
| S68 | Ca, Ba | 0.449 | 0.478 | 0.022 | 0.039 | 0.011 | 1.08 | 3.07 | 5 | Cu, Fe, Zn, Zr | 0.5, 0.5, 0.5, 1 | 1550 | 253 | 0.51 | 0 | 9 |
| S93 | Ca, Ba | 0.449 | 0.478 | 0.022 | 0.039 | 0.011 | 1.08 | 3.07 | 6 | Cu, Fe, Zn, Zr | 0.5, 0.5, 0.5, 1 | 1550 | 240 | 0.49 | 0 | 9 |
| S94 | Ca, Ba | 0.449 | 0.478 | 0.022 | 0.039 | 0.011 | 1.08 | 3.07 | 10 | Cu, Fe, Zn, Zr | 0.5, 0.5, 0.5, 1 | 1400 | 130 | 0.3 | 0 | 5 |
| S95 | Ca, Ba | 0.449 | 0.478 | 0.022 | 0.039 | 0.011 | 1.08 | 3.07 | 15 | Cu, Fe, Zn, Zr | 0.5, 0.5, 0.5, 1 | 1350 | 120 | 0.28 | 0 | 4 |
| S96 | Ca, Ba | 0.449 | 0.478 | 0.022 | 0.039 | 0.011 | 1.08 | 3.07 | 20 | Cu, Fe, Zn, Zr | 0.5, 0.5, 0.5, 1 | 1350 | 110 | 0.27 | 0 | 2 |

First crystal phase (mother phase): $(K_a Na_b Li_c E1_{d1} E2_{d2})_e NbO_f$
(E1 and E2 are at least one of Ca, Sr, and Ba; $a+b+c+d1+d2=1$; e is any value; f is any value that forms a perovskite)

Second crystal phase (subphase): $K_{0.85} Ti_{0.85} Nb_{1.15} O_5$

FIG. 25

| Sample | First crystal phase (mother phase) Elements E1, E2 | a | b | c | d1 | d2 | e | f | Subphase content (mol%) | Additional metal Metal | Additional metal mol% | Relative permittivity $\varepsilon_{33}^T/\varepsilon_0$ | Compliance $s_{33}^E$ (pm²/N) | Piezoelectric constant $d_{33}$ (pC/N) | Electromechanical coupling coefficient Kr | Calcining after mixing mother phase and subphase |
|---|---|---|---|---|---|---|---|---|---|---|---|---|---|---|---|---|
| S04 (Fig. 12) | - | 0.490 | 0.490 | 0.020 | 0.000 | 0.000 | 1.00 | 3.00 | 0 | - | 0 | 430 | 4 | 95 | 0.31 | Absent |
| S101 | Ca, Ba | 0.449 | 0.478 | 0.022 | 0.039 | 0.011 | 1.08 | 3.07 | 5 | Co, Zn, Zr | 0.5, 0.5, 1 | 1427 | 14 | 243 | 0.49 | Absent |
| S102 | Ca, Ba | 0.449 | 0.478 | 0.022 | 0.039 | 0.011 | 1.08 | 3.07 | 1 | Co, Zn, Zr | 0.5, 0.5, 1 | 1023 | 5 | 105 | 0.31 | Present |
| S103 | Ca, Ba | 0.449 | 0.478 | 0.022 | 0.039 | 0.011 | 1.08 | 3.07 | 3 | Co, Zn, Zr | 0.5, 0.5, 1 | 1140 | 8 | 153 | 0.36 | Present |
| S104 | Ca, Ba | 0.449 | 0.478 | 0.022 | 0.039 | 0.011 | 1.08 | 3.07 | 5 | Co, Zn, Zr | 0.5, 0.5, 1 | 1490 | 15 | 256 | 0.52 | Present |
| S105 | Ca, Ba | 0.449 | 0.478 | 0.022 | 0.039 | 0.011 | 1.08 | 3.07 | 8 | Co, Zn, Zr | 0.5, 0.5, 1 | 1520 | 12 | 200 | 0.44 | Present |
| S106 | Ca, Ba | 0.449 | 0.478 | 0.022 | 0.039 | 0.011 | 1.08 | 3.07 | 15 | Co, Zn, Zr | 0.5, 0.5, 1 | 1610 | 7 | 120 | 0.32 | Present |
| S107 | Ca, Ba | 0.449 | 0.478 | 0.022 | 0.039 | 0.011 | 1.05 | 3.05 | 5 | Co, Zn, Zr | 0.5, 0.5, 1 | 1520 | 15 | 262 | 0.52 | Present |
| S108 | Ca, Ba | 0.449 | 0.478 | 0.022 | 0.039 | 0.022 | 1.08 | 3.08 | 5 | Co, Zn, Zr | 0.5, 0.5, 2 | 1720 | 12 | 276 | 0.49 | Present |
| S109 | Ca, Ba | 0.449 | 0.478 | 0.022 | 0.039 | 0.011 | 1.08 | 3.07 | 5 | Co, Zr | 0.5, 1 | 1334 | 10 | 190 | 0.4 | Present |
| S110 | Ca, Ba | 0.449 | 0.478 | 0.022 | 0.039 | 0.004 | 1.08 | 3.06 | 5 | Co, Zn | 0.5, 0.5 | 1110 | 9 | 177 | 0.4 | Present |
| S111 | Ca, Ba | 0.449 | 0.478 | 0.022 | 0.039 | 0.004 | 1.08 | 3.06 | 5 | Co, Fe | 0.5, 0.5 | 1244 | 9 | 181 | 0.37 | Present |
| S112 | Ca, Ba | 0.449 | 0.478 | 0.022 | 0.039 | 0.004 | 1.08 | 3.06 | 5 | Co, Cu | 0.5, 0.5 | 1053 | 8 | 188 | 0.41 | Present |
| S113 | Ca, Ba | 0.449 | 0.478 | 0.022 | 0.039 | 0.011 | 1.08 | 3.07 | 5 | Co, Cu, Zr | 0.5, 0.5, 1 | 1405 | 10 | 222 | 0.42 | Present |
| S114 | Ca, Ba | 0.449 | 0.478 | 0.022 | 0.039 | 0.011 | 1.08 | 3.07 | 5 | Co, Zn, Fe, Zr | 0.5, 0.5, 0.5, 1 | 1504 | 11 | 225 | 0.42 | Present |

First crystal phase (mother phase): $(K_aNa_bLi_cE1_{d1}E2_{d2})_eNbO_f$
(E1 and E2 are at least one of Ca, Sr, and Ba; $a+b+c+d1+d2=1$; e is any value; f is any value that forms a perovskite)

Second crystal phase (subphase): $K_{0.85}Ti_{0.85}Nb_{1.15}O_5$

LEAD-FREE PIEZOELECTRIC CERAMIC COMPOSITION, METHOD FOR PRODUCING SAME, PIEZOELECTRIC ELEMENT USING LEAD-FREE PIEZOELECTRIC CERAMIC COMPOSITION, ULTRASONIC PROCESSING MACHINE, ULTRASONIC DRIVE DEVICE, AND SENSING DEVICE

TECHNICAL FIELD

The present invention relates to lead-free piezoelectric ceramic compositions used for piezoelectric elements and the like, and to ultrasonic processing machines, ultrasonic drive devices, and sensing devices using piezoelectric elements.

BACKGROUND ART

Many of the conventional piezoelectric ceramic (piezoceramics) in mass production are configured from PZT (lead zirconate titanate) materials, and contain lead. In this connection, there is a need for the development of lead-free piezoceramics to eliminate the adverse effects of lead on the environment. For example, compositions represented by composition formula $ANbO_3$ (A is an alkali metal), for example, potassium sodium niobate $((K,Na)NbO_3)$, have been proposed as the materials of such lead-free piezoceramics (referred to as "lead-free piezoelectric ceramic composition"). However, the $ANbO_3$ lead-free piezoelectric ceramic compositions themselves are problematic, because of poor sinterability and poor humidity resistance.

As a countermeasure against such problems, Patent Reference 1 discloses a method whereby copper (Cu), lithium (Li), tantalum (Ta), and the like are added to $ANbO_3$ lead-free piezoelectric ceramic compositions to improve sinterability, and eventually, piezoelectric characteristics.

Patent Reference 2 discloses lead-free piezoelectric ceramic compositions of the general formula $\{Li_x(K_{1-y}Na_y)_{1-x}\}(Nb_{1-z}Sb_z)O_3$ ($0 \leq x \leq 0.2$, $0 \leq y \leq 1.0$, $0 \leq z \leq 0.2$, excluding $x=z=0$) to achieve relatively desirable sinterability and piezoelectric characteristics.

PRIOR ART REFERENCE

Patent Reference

Patent Reference 1: JP-A-2000-313664
Patent Reference 2: JP-A-2003-342069

SUMMARY OF THE INVENTION

Problems that the Invention is to Solve

However, while the piezoelectric ceramic compositions described in Patent Reference 1 improve sinterability, the compositions are inferior to conventional lead-containing piezoelectric ceramic compositions from the standpoint of piezoelectric characteristics, and are insufficient for practical applications. The piezoelectric ceramic compositions described in Patent Reference 2 have a relatively high piezoelectric constant. A problem, however, is that, since the phase transition point falls between −50° C. to +150° C., the characteristics abruptly fluctuate in the vicinity of the phase transition point.

Accordingly, there is a need for a technique that can be used to improve the piezoelectric characteristics of lead-free piezoelectric ceramic compositions. Other improvements are also needed for lead-free piezoelectric ceramic compositions, including cost reduction, resource saving, ease of production, utility, and durability.

Means for Solving the Problems

The present invention has been carried out to solve the foregoing problems, and can be realized in the form of the following aspects or application examples.

(1) According to an aspect of the present invention, there is provided a lead-free piezoelectric ceramic composition. The lead-free piezoelectric ceramic composition mainly includes: a first crystal phase in which a plurality of crystal grains formed of an alkali niobate/tantalate perovskite oxide having piezoelectric characteristics is bound to each other in a deposited state; and a second crystal phase formed of a compound containing titanium (Ti) and filling spaces between the plurality of crystal grains of the first crystal phase. With the lead-free piezoelectric ceramic composition configured as above, the piezoelectric characteristics can be improved more than in other lead-free piezoelectric ceramic compositions that do not include the second crystal phase.

(2) In the lead-free piezoelectric ceramic composition according to the above-described aspect, it is preferable that the second crystal phase is contained in a content of 2 to 10 mol %. With the lead-free piezoelectric ceramic composition according to this aspect, insulation characteristics and piezoelectric characteristics can be further improved.

(3) In the lead-free piezoelectric ceramic composition according to the above-described aspect, the lead-free piezoelectric ceramic composition may further include at least one metal element selected from copper (Cu), iron (Fe), and zinc (Zn), which is contained by being localized more in the second crystal phase than in the first crystal phase With the lead-free piezoelectric ceramic composition according to this aspect, piezoelectric characteristics can be further improved.

(4) In the lead-free piezoelectric ceramic composition according to the above-described aspect, the lead-free piezoelectric ceramic composition may further include at least one metal element selected from cobalt (Co), copper (Cu), iron (Fe), and zinc (Zn), which is contained by being localized more in the second crystal phase than in the first crystal phase. With the lead-free piezoelectric ceramic composition according to this aspect, piezoelectric characteristics can be further improved.

(5) In the lead-free piezoelectric ceramic composition according to the above-described aspect, the lead-free piezoelectric ceramic composition may further include at least one metal element selected from zirconium (Zr) and calcium (Ca), which is contained by being localized more in the first crystal phase than in the second crystal phase. With the lead-free piezoelectric ceramic composition according to this aspect, piezoelectric characteristics can be further improved.

(6) In the lead-free piezoelectric ceramic composition according to the above-described aspect, the compound forming the second crystal phase may be an A-Ti—B—O composite compound (wherein the element A is an alkali metal, the element B is at least one of niobium (Nb) and tantalum (Ta), and each of the contents of the element A, the element B, and titanium (Ti) is not zero). With the lead-free piezoelectric ceramic composition according to this aspect, the second crystal phase can easily be formed.

(7) In the lead-free piezoelectric ceramic composition according to the above-described aspect, the element A may be potassium (K). With the lead-free piezoelectric ceramic composition according to this aspect, the second crystal phase can easily be formed.

(8) In the lead-free piezoelectric ceramic composition according to the above-described aspect, the element B may be niobium (Nb). With the lead-free piezoelectric ceramic composition according to this aspect, the Curie temperature (Tc) can be made higher than when the element B is tantalum (Ta).

(9) In the lead-free piezoelectric ceramic composition according to the above-described aspect, it is preferable that the compound forming the second crystal phase has a lower melting point than the alkali niobate/tantalate perovskite oxide forming the first crystal phase. With the lead-free piezoelectric ceramic composition according to this aspect, the second crystal phase can easily be formed between the crystal grains of the first crystal phase.

(10) A lead-free piezoelectric ceramic composition according to another aspect of the present invention is produced by mixing, molding, and firing a crystal powder formed of an alkali niobate/tantalate perovskite oxide having piezoelectric characteristics and a crystal powder formed of a compound that contains titanium (Ti). With the lead-free piezoelectric ceramic composition according to this aspect, it is possible to form the first crystal phase in which a plurality of crystal grains formed of an alkali niobate/tantalate perovskite oxide is bound to each other in a deposited state, and the second crystal phase formed of a compound that contains titanium (Ti) and filling the spaces between the crystal grains in the first crystal phase. In this way, the piezoelectric characteristics can be improved more than in other lead-free piezoelectric ceramic compositions that do not include the second crystal phase.

(11) A piezoelectric element according to an aspect of the present invention includes a piezoceramic formed from the lead-free piezoelectric ceramic composition according to the above-described aspects; and an electrode mounted on the piezoceramic. With the piezoelectric element according to this aspect, piezoelectric characteristics can be improved.

(12) An ultrasonic processing machine according to an aspect of the present invention includes the piezoelectric element according to the above-described aspect. With the ultrasonic processing machine according to this aspect, process performance and heat durability can be improved.

(13) An ultrasonic drive device according to an aspect of the present invention includes the piezoelectric element according to the above-described aspect. With the ultrasonic drive device according to this aspect, drive performance and heat durability can be improved.

(14) A sensing device according to an aspect of the present invention includes the piezoelectric element according to the above-described aspect. With the sensing device configured according to this aspect, detection performance and heat durability can be improved.

(15) According to an aspect of the present invention, a method for producing a lead-free piezoelectric ceramic composition is provided. The method includes: producing a molded product by mixing and molding a first crystal powder formed of an alkali niobate/tantalate perovskite oxide having piezoelectric characteristics with a second crystal powder formed of a compound that contains titanium (Ti); and producing a lead-free piezoelectric ceramic composition, in which a first crystal phase is formed by binding a plurality of crystal grains of the first crystal powder in a deposited state and a second crystal phase is formed by melting the second crystal powder to fill spaces between the plurality of crystal grains of the first crystal phase, by firing the molded product. With the producing method according to this aspect, it is possible to obtain a lead-free piezoelectric ceramic composition of improved piezoelectric characteristics over the piezoelectric characteristics of other lead-free piezoelectric ceramic compositions that do not include the second crystal phase.

(16) A method for producing a lead-free piezoelectric ceramic composition according to another aspect of the present invention includes: calcining a mixed powder of a first crystal powder and a second crystal powder at a first temperature, the first crystal powder being formed of an alkali niobate/tantalate perovskite oxide having piezoelectric characteristics and the second crystal powder being formed of a compound that contains titanium (Ti); producing a molded product by mixing and molding the mixed powder calcined at the first temperature; and producing a lead-free piezoelectric ceramic composition, in which a first crystal phase is formed by binding a plurality of crystal grains of the first crystal powder in a deposited state and a second crystal phase is formed by melting the second crystal powder to fill spaces between the plurality of crystal grains of the first crystal phase, by firing the molded product at a second temperature higher than the first temperature. With the producing method according to this aspect, it is possible to obtain a lead-free piezoelectric ceramic composition of further improved piezoelectric characteristics over the piezoelectric characteristics of other lead-free piezoelectric ceramic compositions that do not include the second crystal phase.

The aspects of the present invention are not limited to the aspects of the lead-free piezoelectric ceramic composition, the piezoelectric element, the ultrasonic processing machine, the ultrasonic drive device, the sensing device, and the lead-free piezoelectric ceramic composition producing method, and are also applicable to, for example, various types of devices that use lead-free piezoelectric ceramic compositions, and to various methods for producing such devices. Further, the present invention is in no way limited to the foregoing aspects, and can be implemented in a wide range of aspects within the gist of the present invention.

BRIEF DESCRIPTION OF THE DRAWINGS

FIG. 7 is an explanatory view representing the results of experiments for the effects of subphase content and component element on piezoelectric ceramic composition characteristics;

FIG. 9 is an explanatory view representing the results of experiments for the effect of subphase content and other variables on transition temperature;

FIG. 10 is an explanatory view representing the results of experiments for the effect of the coefficient of the mother phase composition formula on the characteristics of the piezoelectric ceramic composition;

FIG. 12 is an explanatory view representing the results of experiments for the effect of additional metals on the characteristics of the piezoelectric ceramic composition;

FIG. 13 is an explanatory view representing the results of experiments for the effect of the presence or absence of subphase on the insulation of the piezoelectric ceramic composition;

FIG. 14 is an explanatory view representing the results of the qualitative analyses of the second crystal phase in the piezoelectric ceramic composition;

FIG. 15 is an explanatory view representing the results of the qualitative analysis of the second crystal phase in the piezoelectric ceramic composition;

FIG. 16 is an explanatory view representing the results of experiments for the effect of additional metals on the characteristics of the piezoelectric ceramic composition;

FIG. 17 is an explanatory view representing the results of the thermal cycle evaluation test for the piezoelectric ceramic composition;

FIG. 18 is an explanatory view representing the results of experiments for the effect of subphase content on the characteristics of the piezoelectric ceramic composition;

FIG. 25 is an explanatory view representing the results of experiments for the characteristics of the piezoelectric ceramic composition;

MODE FOR CARRYING OUT THE INVENTION

A. Configuration of Lead-Free Piezoelectric Ceramic Composition

The piezoelectric ceramic composition as an embodiment of the present invention is a lead-free piezoelectric ceramic composition that mainly includes a first crystal phase formed of a compound having piezoelectric characteristics, and a second crystal phase formed of a compound that does not have piezoelectric characteristics. The lead-free piezoelectric ceramic composition as an embodiment of the present invention typically includes the second crystal phase in a proportion of more than 0 mol % and less than 20 mol %, and the first crystal phase accounting for the reminder. In the following, the first crystal phase will also be referred to as a "mother phase" or "KNN phase", and the second crystal phase as a "subphase" or "NTK phase".

Figure 1:
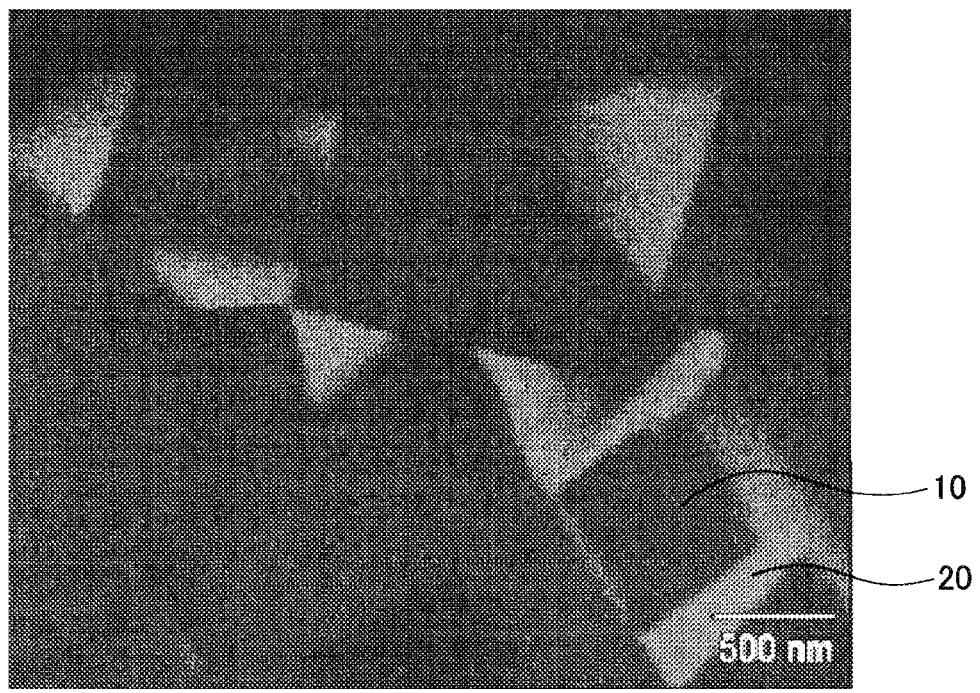
FIG. 1 is an explanatory view showing a structure of a typical lead-free piezoelectric ceramic composition.

FIG. 1 is an explanatory view showing a structure of a typical lead-free piezoelectric ceramic composition. The structure shown in FIG. 1 is of a sample prepared as a thin section of a lead-free piezoelectric ceramic composition after dimpling and ion milling, as observed under a transmission electron microscope (TEM-EDS). In FIG. 1, the black portion indicates a first crystal phase (mother phase) 10 and the white portion indicates a second crystal phase (subphase) 20. As shown in FIG. 1, the first crystal phase 10 is preferably a crystal phase in which a plurality of crystal grains is bound to each other in a deposited state, and the second crystal phase 20 is preferably a crystal phase that fills the spaces between the crystal grains of the first crystal phase 10.

In the lead-free piezoelectric ceramic composition of the structure as shown in FIG. 1, the second crystal phase 20 forming the three-dimensional mesh structure restrains the first crystal phase 10 and creates a distortion in the first crystal phase 10, and thus improves the piezoelectric characteristics. Further, the second crystal phase 20, having a lower melting point than the first crystal phase 10, assumes a liquid phase while the lead-free piezoelectric ceramic composition is being sintered, and fills the spaces in the first crystal phase 10 to suppress formation of pores, thereby improving sinterability and insulation. Further, because of the difference in insulation between the first crystal phase 10 and the second crystal phase 20, the domain structure is segmented at the time of the polarization, and the piezoelectric characteristics improve. Further, because the thermal behaviors of the first crystal phase 10 and the second crystal phase 20 are different, the temperature characteristics are more stabilized compared with using the first crystal phase 10 alone.

Preferably, an alkali niobate/tantalate perovskite oxide is used as the compound forming the first crystal phase 10. As used herein, "alkali niobate/tantalate perovskite oxide" is a collective term used to refer to two types of perovskite oxides, specifically an alkali niobate perovskite oxide and an alkali tantalate perovskite oxide.

The alkaline component of the alkali niobate/tantalate perovskite oxide forming the first crystal phase 10 contains at least alkali metals (such as K (potassium), Na (sodium), and Li (lithium)), and may contain alkali earth metals (such as Ca (calcium), Sr (strontium), and Ba (barium)). The alkali niobate|tantalate perovskite oxide preferably represents those represented by the following composition formula.

<Preferred Composition Formula of First Crystal Phase>

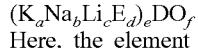

Here, the element E is at least one alkali earth metal selected from Ca (calcium), Sr (strontium), and Ba (barium). The element D is at least one of Nb (niobium) and Ta (tantalum). The symbols a, b, c, and d satisfy a+b+c+d=1, and e and f are any values.

In the foregoing composition formula, K (potassium), Na (sodium), Li (lithium), and element E (Ca, Sr, Ba) are located at the so-called A site of the perovskite structure, whereas element D (Nb, Ta) is located at the so-called B site of the perovskite structure. Specifically, the alkali niobate/tantalate perovskite oxide is a perovskite oxide that may contain one or more alkali metals (K, Na, Li), and alkali earth metals (Ca, Sr, Ba) at the A site, and that contains at least one of Nb (niobium) and Ta (tantalum) at the B site.

The values of coefficients a to f in the composition formula are selected in combinations that establish the perovskite structure, and that are preferred from the standpoint of the electrical characteristics or piezoelectric characteristics (particularly, piezoelectric constant $d_{33}$) of the lead-free piezoelectric ceramic composition. Specifically, coefficients a to d satisfy $0 \le a \le 1$, $0 \le b \le 1$, $0 \le c \le 1$, and $0 \le d \le 1$, excluding a=b=c=0 (namely, excluding compositions that do not contain any of K (potassium). Na (sodium), and Li (lithium)). The coefficients a and b of K (potassium) and Na (sodium) are typically $0 < a \le 0.6$, and $0 < b \le 0.6$. The coefficient c of Li (lithium) may be zero, and is preferably $0 < c \le 0.2$, further preferably $0 < c \le 0.1$. The coefficient d of the element E (Ca, Sr, Ba) may be zero, and is preferably $0 < d \le 0.1$, further preferably $0 < d \le 0.05$. The coefficient e for the A site as a whole may have any value, and is typically $0.9 \le e \le 1.1$, preferably $0.97 \le e \le 1.08$, and further preferably $1.00 \le e \le 1.08$.

In the foregoing composition formula, K, Na, and Li have a valency of +1, element E (Ca, Sr, Ba) has a valency of +2, element D (Nb, Ta) has a valency of +5, and O (oxygen) has a valency of +2. The coefficient f takes any value that allows the first crystal phase 10 to form the perovskite oxide, and typically has a value of approximately 3. From the electrical neutralization conditions of the composition, the coefficients a to f can be represented by the following equation (1).

$$(a+b+c+2 \cdot d) \cdot e + 5 \approx 2 \cdot f \quad (1)$$

A typical composition of the first crystal phase 10 is $(K, Na, Li, Ca)_{1.07}NbO_{3.06}$ (coefficients a to d are omitted). The first crystal phase 10 of the composition above contains K (potassium), Na (sodium), and Nb (niobium) as the main metallic components, and as such the material is also referred to as "KNN material", and the first crystal phase 10 as "KNN phase". As exemplified above, a piezoelectric ceramic composition having excellent characteristics can be obtained at low cost upon selecting Ca (calcium) and Nb (niobium) as elements E and D, respectively.

Preferably, a compound containing titanium (Ti) is used as the compound forming the second crystal phase 20, and those represented by, for example, the following composition formula are preferably used.
<Preferred Composition Formula of Second Crystal Phase>
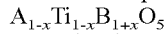
$A_{1-x}Ti_{1-x}B_{1+x}O_5$ Here, the element A is at least one alkali metal (such as K (potassium), Rb (rubidium), and Cs (cesium)). The element B is at least one of Nb (niobium) and Ta (tantalum). The symbol x is any value. Preferably, the coefficient x satisfies $0 \le x \le 0.15$. In this range of coefficient x, the second crystal phase 20 can have a stable structure, and a uniform crystal phase can be obtained.

Specific examples of the second crystal phase 20 in accordance with the foregoing composition formula include $KTiNbO_5$, $K_{0.90}Ti_{0.90}Nb_{1.10}O_5$, $K_{0.85}Ti_{0.85}Nb_{1.15}O_5$, $RbTiNbO_5$, $Rb_{0.90}Ti_{0.90}Nb_{1.10}O_5$, $Rb_{0.85}Ti_{0.85}Nb_{1.15}O_5$, $CsTiNbO_5$, $Cs_{0.90}Ti_{0.90}Nb_{1.10}O_5$, $KTiTaO_5$, and $CsTiTaO_5$. From the standpoint of the structural stability of the second crystal phase 20, the coefficient x preferably satisfies $0 \le x \le 0.15$ when element A is K (potassium) or Rb (rubidium), and $0 \le x \le 0.10$ when element A is Cs (cesium). A piezoelectric ceramic composition having excellent characteristics can be obtained at low cost upon selecting K (potassium) and Nb (niobium) as elements A and B, respectively.

The second crystal phase 20 does not have piezoelectric characteristics; however, the second crystal phase 20 can improve both sinterability and insulation by being used with the first crystal phase 10. Further, the second crystal phase 20 is believed to have contribution in the effect of preventing the occurrence of a phase transition point between −50° C. and +150° C. The second crystal phase 20 is a laminar structure compound (or a laminar compound), and it is believed that, by being a laminar structure compound, the second crystal phase 20 improves the insulation of the piezoelectric ceramic composition and contributes to the effect of preventing the occurrence of a phase transition point. Note that the second crystal phase 20 as having a stable structure is disclosed in H. Rebbah et al., Journal of Solid State Chemistry, Vol. 31, p. 321-328, 1980, the entire disclosure of which is herein incorporated by reference.

The content of the second crystal phase 20 may be more than 0 mol % and less than 20 mol %, and is preferably from 2 mol % to 15 mol %, further preferably from 2 mol % to 10 mol %. A composition that does not contain the second crystal phase 20 (a composition containing only the first crystal phase 10) tends to undergo abrupt characteristics fluctuations between −50° C. and +150° C. A content of the second crystal phase 20 in excess of 10 mol % has the risk of lowering the piezoelectric characteristics (particularly, piezoelectric constant $d_{33}$).

A typical composition of the second crystal phase 20 is $K_{0.85}Ti_{0.85}Nb_{1.15}O_5$. The second crystal phase 20 of the composition above contains Nb (niobium), Ti (titanium), and K (potassium) as the main metallic components, and as such the material is also referred to as "NTK material", and the second crystal phase 20 as "NTK phase".

Also preferred as the second crystal phase 20 other than the crystal phase represented by $A_{1-x}Ti_{1-x}B_{1+x}O_5$ is a crystal phase represented by $A_1Ti_3B_1O_9$. Though typically omitted, the coefficient 1 is intentionally recited in some cases to clearly distinguish the formula from the crystal phase represented by $A_{1-x}Ti_{1-x}B_{1+x}O_5$. In the following, the crystal phase represented by $A_{1-x}Ti_{1-x}B_{1+x}O_5$ is also referred to as "NTK1115 phase" or simply "1115 phase", and the crystal phase represented by $A_1Ti_3B_1O_9$ as "NTK1319 phase", or simply "1319 phase".

In the crystal phase represented by $A_1Ti_3B_1O_9$, the element A is at least one alkali metal (such as K (potassium), Rb (rubidium), and Cs (cesium)), and the element B is at least one of Nb (niobium) and Ta (tantalum). The second crystal phase 20 represented by $A_1Ti_3B_1O_9$ does not have piezoelectric characteristics; however, the second crystal phase 20 of this composition also can improve both sinterability and insulation by being used with the first crystal phase 10. The second crystal phase 20 of the composition above is also believed to have contribution in the effect of preventing the occurrence of a phase transition point between −50° C. and +150° C.

The content of the second crystal phase 20 represented by $A_1Ti_3B_1O_9$ may be more than 0 mol % and less than 20 mol %, and is preferably from 2 mol % to 15 mol %, further preferably from 2 mol % to 10 mol %. A composition that does not contain the second crystal phase 20 (a composition containing only the first crystal phase 10) tends to undergo abrupt characteristics fluctuations between −50° C. to +150° C. Further, a content of the second crystal phase 20 in excess of 10 mol % has the risk of lowering the piezoelectric characteristics (particularly, piezoelectric constant $d_{33}$).

The crystal phase represented by $A_{1-x}Ti_{1-x}B_{1+x}O_5$, and the crystal phase represented by $A_1Ti_3B_1O_9$ are common in that both are compound oxides of element A (alkali metal), Ti (titanium), and element B (at least one of Nb and Ta). Such compound oxides of element A, Ti (titanium), and element B are called "A-Ti—B—O compound oxides". In the present invention, an A-Ti—B—O compound oxide (element A is an alkali metal; element B is at least one of Nb and Ta; and the contents of element A, element B, and Ti are not zero) may be used as the second crystal phase 20. Particularly preferred is an A-Ti—B—O compound oxide that does not have piezoelectric characteristics itself, and that can improve both sinterability and insulation by being used with the first crystal phase 10, and can prevent the occurrence of a phase transition point between −50° C. and +150° C.

The lead-free piezoelectric ceramic composition as an embodiment of the present invention may contain at least one metal element selected from Cu (copper), Ni (nickel), Co (cobalt), Fe (iron), Mn (manganese), Cr (chromium), Zr (zirconium), Ag (silver), Zn (zinc), Sc (scandium), and Bi (bismuth). Adding these metal elements can improve the characteristics (particularly, piezoelectric constant $d_{33}$) of the lead-free piezoelectric ceramic composition. The total content of the additional metals is preferably 5 mol % or less, further preferably 1 mol % or less. A total additional metal content in excess of 5 mol % has the risk of lowering the piezoelectric characteristics. When adding two or more metals, each additional metal is preferably added in less than 1 mol %. A content of each additional metal exceeding 1 mol % has the risk of lowering the piezoelectric characteristics.

B. Piezoelectric Element Producing Method

B1. First Producing Method

Figure 2:
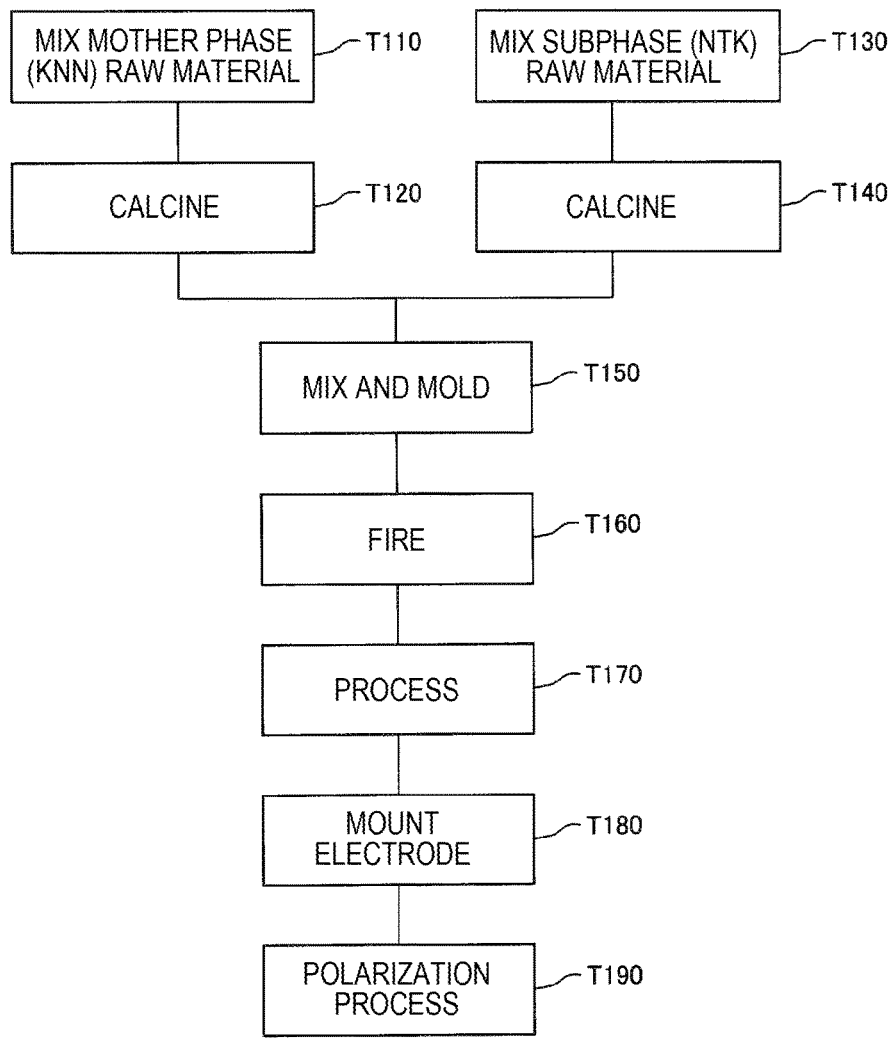
FIG. 2 is an explanatory view representing a piezoelectric element producing method.

FIG. 2 is an explanatory view representing a piezoelectric element producing method. The piezoelectric element produced by using the method of FIG. 2 is a device equipped with a piezoceramic formed of the lead-free piezoelectric ceramic composition.

As represented in FIG. 2, in process T110, the required raw material of the mother phase (KNN phase) is selected from materials such as a $K_2CO_3$ powder, a $Na_2CO_3$ powder, a $Li_2CO_3$ powder, a $CaCO_3$ powder, a $SrCO_3$ powder, a $BaCO_3$ powder, a $Nb_2O_5$ powder, and a $Ta_2O_5$ powder, and is weighed according to the values of the coefficients a to e in the mother phase composition formula. Then, ethanol is added to the raw material powders, and the whole is wet mixed with a ball mill for preferably at least 15 hours to obtain a slurry. In process T120, a mixed powder obtained by drying the slurry is calcined, for example, under an air atmosphere at 600 to 1,000° C. for 1 to 10 hours to produce a mother phase calcined product.

In process T130, the required raw material of the subphase (NTK phase) is selected from materials such as a $K_2CO_3$ powder, a $Rb_2CO_3$ powder, a $Cs_2CO_3$ powder, a $TiO_2$ powder, a $Nb_2O_5$ powder, and a $Ta_2O_5$ powder, and is weighed according to the value of the coefficient x in the subphase composition formula. Then, ethanol is added to the raw material powders, and the whole is wet mixed with a ball mill for preferably at least 15 hours to obtain a slurry. In process T140, a mixed powder obtained by drying the slurry is calcined, for example, under the air atmosphere at 600 to 1,000° C. for 1 to 10 hours to produce a subphase calcined product.

In process T150, the mother phase calcined product and the subphase calcined product are separately weighed, and pulverized and mixed with a ball mill after adding a dispersant, a binder, and ethanol to obtain a slurry. When additional metals are added, the required material is selected from materials such as a CuO powder, an $Fe_2O_3$ powder, a NiO powder, an $Ag_2O$ powder, a $ZrO_2$ powder, a ZnO powder, a MgO powder, a $Sc_2O_3$ powder, a $Bi_2O_3$ powder, a $Cr_2O_3$ powder, a $MnO_2$ powder, and a CoO powder, weighed, and mixed into a slurry. The slurry may be calcined again, and pulverized and mixed.

Note that the additional metals added in process T150 are metal oxides, and the content of each additional metal is preferably given in terms of the mol % of a simple substance metal. Instead of being added as metal oxides containing only the additional metals, the additional metals added to the first crystal phase (mother phase) and the second crystal phase (subphase) in process T150 may be in the form of oxide $EMO_3$ (where element E is at least one of Ca, Sr, and Ba, and element M is the additional metal) that contains an alkali earth metal and the additional metal. The element E (alkali earth metal element) contained as a third component in the oxide EMO3 is used as the element E in the first crystal phase of the piezoceramic after the firing.

In process T150, the slurry obtained from the mother phase calcined product and the subphase calcined product is dried, granulated, and uniaxially pressed to be molded into a desired shape (for example, disk shape or cylindrical shape), for example, under 20 MPa pressure. Subsequently, for example, the product is subjected to a CIP process (cold isostatic pressing) under 150 MPa pressure to obtain a CIP pressed body.

In process T160, the CIP pressed body obtained in process T150 is held and fired, for example, under the air atmosphere at 900 to 1,300° C. for 1 to 10 hours to obtain a piezoceramic of the lead-free piezoelectric ceramic composition. The firing may be performed under a reduction atmosphere or $O_2$ atmosphere. The subphase NTK material has a lower melting point than the mother phase KNN material, and thus the plurality of crystal grains of KNN material in the mother phase melts in the maintained particle state during the firing performed in process T160, and the adjacent crystal grains bind to each other in the deposited state. Meanwhile, the subphase NTK material melts into a liquid phase, and flows into and fills the spaces formed between the crystal grains of the KNN material.

In process T170, the piezoceramic obtained in process T160 is processed at the dimensional accuracy required of the piezoelectric element. In process T180, electrodes are mounted on the piezoceramic, and a polarization process is performed in process T190.

With the producing method described above, the lead-free piezoelectric ceramic composition can be obtained that has improved piezoelectric characteristics over other lead-free piezoelectric ceramic compositions that do not have the second crystal phase. It should be noted that the producing method described above is merely an example, and other processes and process conditions used for piezoelectric element production can be appropriately used. The method that involves the mixing and firing of the mother phase calcined product and the subphase calcined product as in the producing method of FIG. 2 is also called a "two-phase control method".

B2. Second Producing Method

Figure 24:
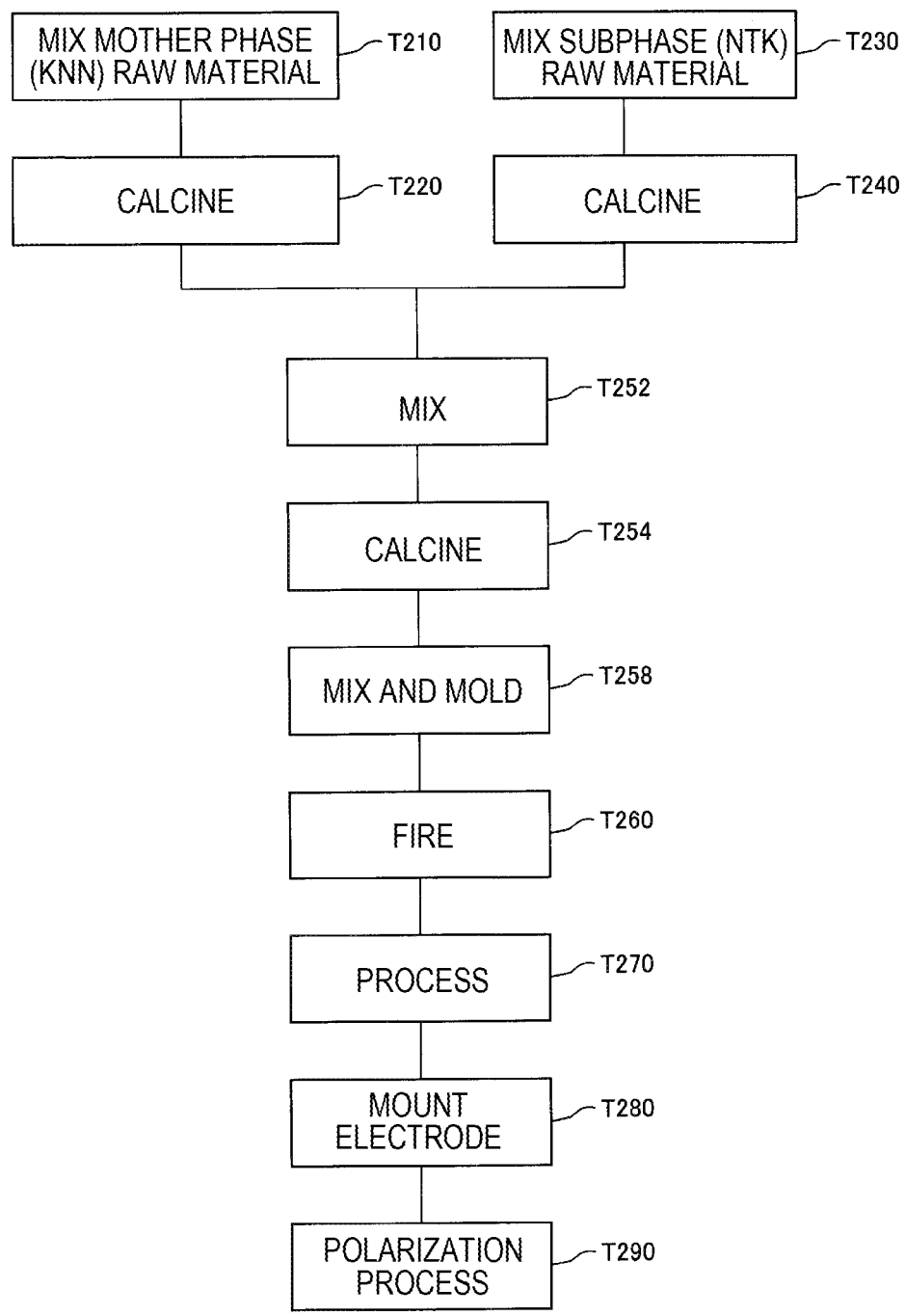
FIG. 24 is an explanatory view representing a piezoelectric element producing method.

FIG. 24 is an explanatory view representing a piezoelectric element producing method. The piezoelectric element produced by using the producing method of FIG. 24 is a device equipped with a piezoceramic of the lead-free piezoelectric ceramic composition.

As represented in FIG. 24, in process T210, the required raw material of the mother phase (KNN phase) is selected from materials such as a $K_2CO_3$ powder, a $Na_2CO_3$ powder, a $Li_2CO_3$ powder, a $CaCO_3$ powder, a $SrCO_3$ powder, a $BaCO_3$ powder, a $Nb_2O_5$ powder, and a $Ta_2O_5$ powder, and weighed according to the values of the coefficients a to e in the mother phase composition formula. Then, ethanol is added to the raw material powders, and the whole is wet mixed with a ball mill for preferably at least 15 hours to obtain a slurry. In process T220, a mixed powder obtained by drying the slurry is calcined, for example, under the air atmosphere at 600 to 1,000° C. for 1 to 10 hours to produce a mother phase calcined product.

In process T230, the required raw material of the subphase (NTK phase) is selected from materials such as a $K_2CO_3$ powder, a $Rb_2CO_3$ powder, a $Cs_2CO_3$ powder, a $TiO_2$ powder, a $Nb_2O_5$ powder, and a $Ta_2O_5$ powder, and weighed according to the value of the coefficient x in the subphase composition formula. Then, ethanol is added to the raw material powders, and the whole is wet mixed with a ball mill for preferably at least 15 hours to obtain a slurry. In process T240, a mixed powder obtained by drying the slurry is calcined, for example, under the air atmosphere at 600 to 1,000° C. for 1 to 10 hours to obtain a calcined product and produce a subphase calcined product.

In process T252, the mother phase calcined product and the subphase calcined product are separately weighed, and pulverized and mixed with a ball mill after adding ethanol to obtain a slurry. In process T254, a mixed powder obtained by drying the slurry is calcined under the air atmosphere at a first temperature (for example, 600 to 1,000° C.) for 1 to 10 hours to obtain a calcined product and produce a mixed calcined product. The first temperature used for the calcining (process T254) is lower than the temperature at which the powder derived from the subphase calcined product is sintered.

In process T258, the mixed calcined product is weighed, and pulverized and mixed after adding a dispersant, a binder, and ethanol, to obtain a slurry. When additional metals are added, the required material is selected from materials such as a CuO powder, an $Fe_2O_3$ powder, a NiO powder, a $Ag_2O$ powder, a $ZrO_2$ powder, a ZnO powder, a MgO powder, a $Sc_2O_3$ powder, a $Bi_2O_3$ powder, a $Cr_2O_3$ powder, a $MnO_2$ powder, and a CoO powder, weighed, and mixed into a slurry.

Note that the additional metals added in process T258 are metal oxides, and the content of each additional metal is preferably given in terms of the mol % of a simple substance metal. Instead of being added as metal oxides containing only the additional metals, the additional metals mixed with the first crystal phase (mother phase) and the second crystal phase (subphase) in process T258 may be in the form of oxide $EMO_3$ (where the element E is at least one of Ca, Sr, and Ba, and the element M is the additional metal) that contains an alkali earth metal and the additional metal. The element E (alkali earth metal element) contained as a third component in the oxide $EMO_3$ is used as the element E in the first crystal phase of the piezoceramic after the firing.

In process T258, the slurry obtained from the mother phase calcined product and the subphase calcined product is dried, granulated, and uniaxially pressed to be molded into a desired shape (for example, disk-shaped or cylindrical), for example, under 20 MPa pressure. Subsequently, for example, the product is subjected to a CIP process (cold isostatic pressing) under 150 MPa pressure to obtain a CIP pressed body.

In process T260, the CIP pressed body obtained in process T258 is held and fired, for example, under the air atmosphere for 1 to 10 hours at a second temperature (for example, 900 to 1,300° C.) higher than the first temperature used for the calcining in process T254 to obtain a piezoceramic of the lead-free piezoelectric ceramic composition. The firing may be performed under a reduction atmosphere or $O_2$ atmosphere. The subphase NTK material has a lower melting point than the mother phase KNN material, and thus the plurality of crystal grains of KNN material in the mother phase melts in the maintained particle state during the firing performed in process T260, and the adjacent crystal grains bind to each other in the deposited state. Meanwhile, the subphase NTK material melts into a liquid phase, and flows into and fills the spaces formed between the crystal grains of the KNN material.

In process T270, the piezoceramic obtained in process T260 is processed at the dimensional accuracy required of the piezoelectric element. In process T280, electrodes are mounted on the piezoceramic, and a polarization process is performed in process T290.

With the producing method described above, the lead-free piezoelectric ceramic composition can be obtained that has further improved piezoelectric characteristics over other lead-free piezoelectric ceramic compositions that do not have the second crystal phase. It should be noted that the producing method described above is merely an example, and other processes and process conditions used for piezoelectric element production can be appropriately used. The method that involves the mixing and firing of the mother phase calcined product and the subphase calcined product as in the producing method of FIG. 24 is also called a "two-phase control method".

C. Device Using the Lead-Free Piezoelectric Ceramic Composition

C1. Piezoelectric Element

Figure 3:
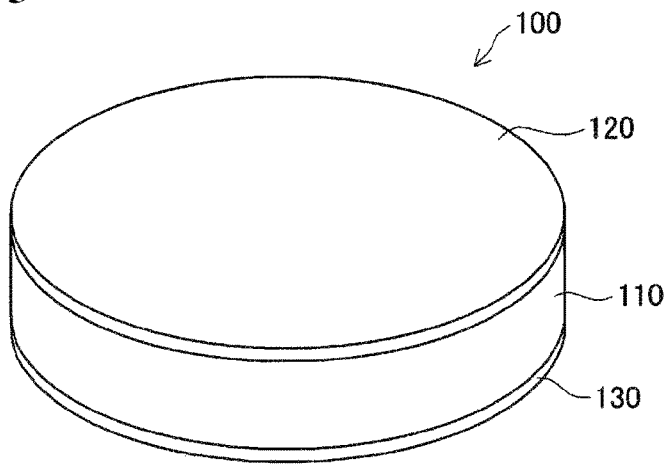
FIG. 3 is a perspective view showing a piezoelectric element of an embodiment of the present invention.

FIG. 3 is a perspective view showing a piezoelectric element 100 of an embodiment of the present invention. The piezoelectric element 100 of FIG. 3 is produced by using the producing method of FIG. 2, and includes a piezoceramic 110, and a pair of electrodes 120 and 130. The piezoceramic 110 of the piezoelectric element 100 is formed from the lead-free piezoelectric ceramic composition, and has a disk shape in the example of FIG. 3. The electrodes 120 and 130 of the piezoelectric element 100 are mounted on the both sides of the piezoceramic 110. In the example of FIG. 3, the electrodes 120 and 130 are disk-shaped as is the piezoceramic 110, and are mounted on the both end surfaces of the piezoceramic 110.

The piezoelectric element 100 can improve the piezoelectric characteristics. Note that the configuration of the piezoelectric element is not limited to the one shown in FIG. 3, and the piezoelectric element can be implemented in a variety of configurations.

C2. Sensing Device

Figure 4:
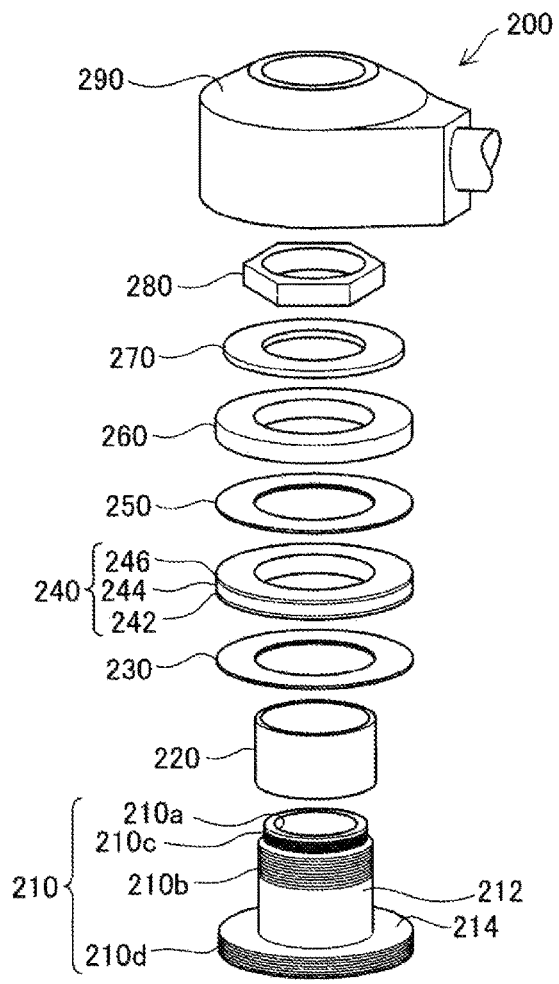
FIG. 4 is an exploded perspective view showing a sensing device of an embodiment of the present invention.

FIG. 4 is an exploded perspective view showing a sensing device 200 of an embodiment of the present invention. The sensing device 200 is a detector that uses the piezoelectric element produced by using the producing method of FIG. 2, and is a so-called non-resonant type knock sensor in the example of FIG. 4. The sensing device 200 includes a metal shell 210, an insulating sleeve 220, an insulating plate 230, a piezoelectric element 240, an insulating plate 250, a characteristic adjusting weight 260, a washer 270, a nut 280, and a housing 290.

The metal shell 210 of the sensing device 200 is configured from a cylindrical tube 212 having formed therein a through hole 210a, and a flange-like seating portion 214 extending out at one end portion of the tube 212. The circumference at the end portion of the tube 212 opposite from the seating portion 214 is engraved with screw threads 210b. The circumferential portions of the tube 212 and the seating portion 214 are engraved with grooves 210c and 210d, respectively, for improved contact with the housing 290. The metal shell 210 is an integral unit formed by using appropriate producing methods (such as casting, forging, and machining). The surface of the metal shell 210 is plated (e.g., zinc chromate plating) to improve corrosion resistance.

The insulating sleeve 220 of the sensing device 200 is a hollow cylindrical member, and is formed of insulating material (e.g., plastic materials such as PET and PBT, and rubber materials). The insulating plates 230 and 250 of the sensing device 200 are hollow disk-shaped members, and are formed of insulating material (e.g., plastic materials such as PET and PBT, and rubber materials).

The piezoelectric element 240 of the sensing device 200 is produced by using the producing method of FIG. 2, and serves as a vibration detecting means for detecting vibration. The piezoelectric element 240 is configured as a laminate of thin plate electrodes 242 and 246, and a piezoceramic 244 disposed therebetween, and forms a hollow disk-shaped member as a whole.

The characteristic adjusting weight 260 of the sensing device 200 is a hollow disk-shaped member, and is formed of various metallic materials such as brass. The washer 270 and the nut 280 of the sensing device 200 are formed of various metallic materials.

In the sensing device 200, the insulating sleeve 220 is fitted to the tube 212 of the metal shell 210. The insulating plate 230, the piezoelectric element 240, the insulating plate 250, and the characteristic adjusting weight 260 are fitted to the insulating sleeve 220, in order. In this state, the nut 280 is threadably mounted on the screw threads 210b on the tube 212 of the metal shell 210 via the washer 270. In this way, the insulating plate 230, the piezoelectric element 240, the insulating plate 250, the characteristic adjusting weight 260, and the washer 270 are fixed by being held between the seating portion 214 of the metal shell 210 and the nut 280. The housing 290 formed of injection molded insulating material (various plastic materials such as PA) is provided for the metal shell 210 fixing its components, and the components fixed to the metal shell 210 are covered with the housing 290.

The piezoelectric element 240 in the sensing device 200 is surrounded by the insulating sleeve 220, the insulating plates 230 and 250, and the housing 290, and are electrically insulated from the metal shell 210 and the characteristic adjusting weight 260. Lead wires (not illustrated) leading out of the housing 290 are electrically connected to the thin plate electrodes 242 and 246 of the piezoelectric element 240.

The sensing device 200 uses the piezoelectric element 240 of excellent piezoelectric characteristics, and can thus improve the detection performance and heat durability. It is therefore possible to suppress detection errors and inaccurate detection. It should be noted that the configuration of the sensing device is not limited to the one shown in FIG. 4, and the sensing device can be implemented not only as a knock sensor but in a variety of other configurations, including ultrasonic sensors, and vibration sensors.

C3. Ultrasonic Drive Device

Figure 5:
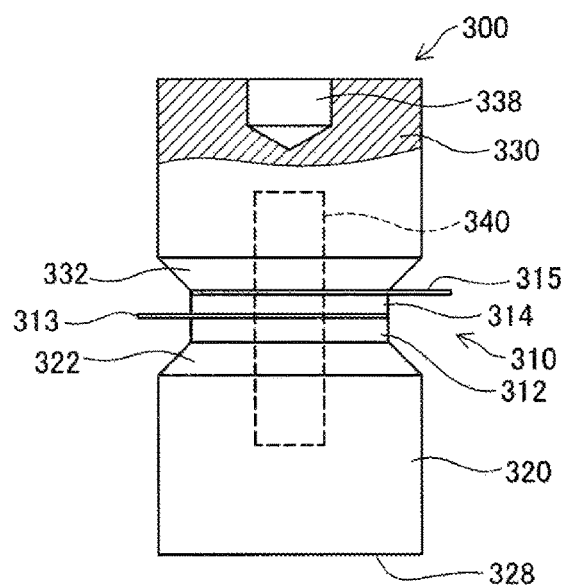
FIG. 5 is a longitudinal sectional view of an ultrasonic drive device of an embodiment of the present invention.

FIG. 5 is a longitudinal sectional view of an ultrasonic drive device 300 of an embodiment of the present invention. The ultrasonic drive device 300 is a drive device that uses the piezoelectric element produced by using the producing method of FIG. 2. In the example of FIG. 5, the ultrasonic drive device 300 is a so-called Langevin-type ultrasonic transducer. The ultrasonic drive device 300 includes a piezoelectric element pair 310, a front panel 320, a backing panel 330, and a center bolt 340.

The piezoelectric element pair 310 of the ultrasonic drive device 300 is disposed between the front panel 320 and the backing panel 330, and these are attached to each other in one piece with the center bolt 340. The piezoelectric element pair 310 includes a pair of hollow disk-shaped piezoelectric elements 312 and 314, and a pair of electrode plates 313 and 315. The components of the piezoelectric element pair 310 are arranged in order from the piezoelectric element 312, the electrode plate 313, the piezoelectric element 314, and to the electrode plate 315, relative to the direction from the front panel 320 side toward the backing panel 330. The piezoelectric elements 312 and 314 are produced by using the producing method of FIG. 2, and serve as a driving means for causing vibrations.

The front panel 320 and the backing panel 330 of the ultrasonic drive device 300 are formed of cylindrical metal blocks (for example, iron or aluminum). The front panel 320 has a larger diameter than the piezoelectric element 312, and the portion in contact with the piezoelectric element 312 is a conical portion 322 of decreasing diameters that match the diameter of the piezoelectric element 312 on the side of the piezoelectric element 312. The backing panel 330 has a larger diameter than the piezoelectric element 314, and the portion in contact with the piezoelectric element 314 via the electrode plate 315 is a conical portion 332 of decreasing diameters that match the diameter of the piezoelectric element 314 on the side of the piezoelectric element 314. The diameters of the front panel 320 and the backing panel 330 are substantially the same.

The end portion of the front panel 320 opposite from the piezoelectric element pair 310 forms an ultrasonic radiation surface 328 where ultrasonic radiates. The end portion of the backing panel 330 opposite from the piezoelectric element pair 310 side has a blind end hole 338 that extends along the axis line of the ultrasonic drive device 300. The total length along the axis line of the ultrasonic drive device 300 substantially coincides with the resonant length of the 3/2 wavelength of resonant frequency.

The ultrasonic drive device 300 uses the piezoelectric elements 312 and 314 of excellent piezoelectric characteristics, and can thus improve the drive performance and heat durability. It is therefore possible to produce ultrasonic at stable frequencies. It should be noted that the configuration of the ultrasonic drive device is not limited to the one shown in FIG. 5, and the ultrasonic drive device can be implemented not only as an ultrasonic transducer but in a variety of other configurations, including ultrasonic actuators, and ultrasonic motors.

C4. Ultrasonic Processing Machine

Figure 6:
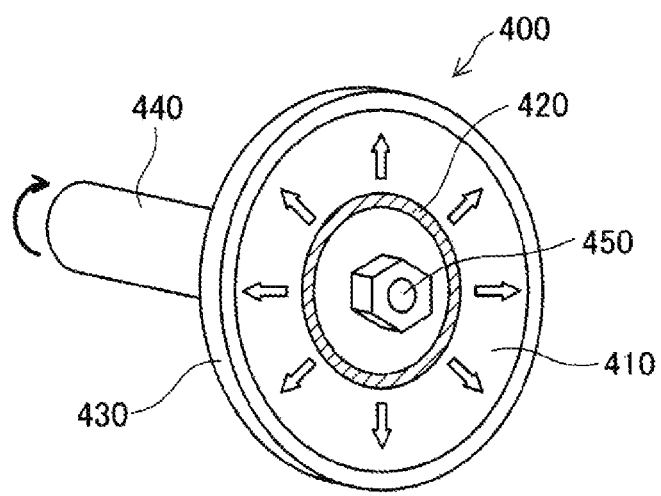
FIG. 6 is a perspective view showing an ultrasonic processing machine of an embodiment of the present invention.

FIG. 6 is a perspective view showing an ultrasonic processing machine 400 of an embodiment of the present invention. The ultrasonic processing machine 400 is a processing device that uses the piezoelectric element produced by using the producing method of FIG. 2. In the example of FIG. 6, the ultrasonic processing machine 400 is a cutting tool for cutting a target object. The ultrasonic processing machine 400 includes a base 410, a piezoelectric element 420, a grinding stone portion 430, a spindle 440, and a mounting jig 450.

The base 410 of the ultrasonic processing machine 400 is a disk-shaped member, and has the grinding stone portion 430 formed around its circumference. The center of the base 410 is fixed to the spindle 440 with the mounting jig 450.

The piezoelectric element 420 of the ultrasonic processing machine 400 is produced by using the producing method of FIG. 2. The piezoelectric element 420, circular in shape, is embedded in the both surfaces of the base 410, and serves as a driving means for producing vibration. The drive direction of the piezoelectric element 420 is the radial direction from the center to the circumference of the base 410. For cutting a target object, the grinding stone portion 430 formed on the circumference of the base 410 is pressed against the target object while rotating the spindle 440 about the axis line under the vibration produced by the piezoelectric element 420.

The ultrasonic processing machine 400 uses the piezoelectric element 420 of excellent piezoelectric characteristics, and can thus improve the process performance and heat durability. It should be noted that the configuration of the ultrasonic processing machine is not limited to the one shown in FIG. 6, and the ultrasonic processing machine can be implemented not only as a cutting tool but in a variety of other configurations, including bonding devices (bonders), ultrasonic sealing devices, and ultrasonic cleaning machines.

The piezoelectric ceramic composition and the piezoelectric element of the embodiment of the present invention have a wide range of potential applications, including vibration detection, pressure detection, oscillation, and piezoelectric devices. Examples include piezoelectric devices, such as sensors, transducers, actuators, and filters, high voltage generating devices, micro power sources, batteries, various drive devices, position control devices, vibration suppressing devices, fluid ejecting devices (such as coating ejection devices, and fuel ejection devices). Further, the piezoelectric ceramic composition and the piezoelectric element of the embodiment of the present invention are particularly preferable in applications where excellent heat durability is needed (for example, knock sensors, and combustion pressure sensors).

EXAMPLES

FIG. 7 is an explanatory view representing the results of experiments for the effects of subphase content and component element on piezoelectric ceramic composition characteristics. The experiment results presented in FIG. 7 represent the characteristics of a plurality of sample compositions, including Examples of the present invention. These experiment results can be used to evaluate the effect of subphase content on the characteristics of the piezoelectric ceramic compositions. The results also can be used to evaluate the effects of the type of subphase component element B (Nb, Ta) and the type of main phase component element E (Ca, Sr, Ba) on the characteristics of the piezoelectric ceramic compositions.

Sample S01 to S04 in FIG. 7 were prepared as samples of a Comparative Example. The samples S01 and S02 were configured from only the second crystal phase. The samples S01 and S02 were prepared by weighing a $K_2CO_3$ powder, a $Nb_2O_5$ powder, and a $TiO_2$ powder to make the coefficient x in the composition formula of the second crystal phase as presented in FIG. 7. Then, ethanol was added to the powders, and the whole was wet mixed with a ball mill for 15 hours to obtain a slurry. Subsequently, a mixed powder obtained by drying the slurry was calcined under the air atmosphere at 600 to 1,000° C. for 1 to 10 hours to obtain a calcined product. The calcined product was pulverized and mixed with a ball mill after adding a dispersant, a binder, and ethanol to obtain a slurry. Subsequently, the slurry was dried, granulated, and uniaxially pressed and molded into a disk shape (diameter 20 mm; thickness 2 mm) under 20 MPa pressure. Subsequently, the product was subjected to a CIP process under 150 MPa pressure, and the resulting CIP pressed body was held and fired under the air atmosphere at 900 to 1,300° C. for 1 to 10 hours.

The samples S03 and S04 were configured from only the first crystal phase. The samples S03 and S04 were prepared by weighing a $K_2CO_3$ powder, a $Na_2CO_3$ powder, a $Li_2CO_3$ powder, a $Nb_2O_5$ powder to make the coefficients a, b, c, d, and e of the composition formula of the first crystal phase as presented in FIG. 7. Then, ethanol was added to the powders, and the whole was wet mixed with a ball mill for 15 hours to obtain a slurry. Subsequently, a mixed powder obtained by drying the slurry was calcined under the air atmosphere at 600 to 1,000° C. for 1 to 10 hours to obtain a calcined product. The calcined product was pulverized and mixed with a ball mill after adding a dispersant, a binder, and ethanol to obtain a slurry. Subsequently, the slurry was dried, granulated, and uniaxially pressed and molded into a disk shape (diameter 20 mm; thickness 2 mm) under 20 MPa pressure. Subsequently, the product was subjected to a CIP process under 150 MPa pressure, and the resulting CIP pressed body was held and fired under the air atmosphere at 900 to 1,300° C. for 1 to 10 hours.

Samples S05 to S15 represent compositions that contain both the first crystal phase and the second crystal phase. The samples S05 to S15 were prepared according to the processes T110 to T160 of FIG. 2. The samples after the molding in process T150 had a disk shape (diameter 20 mm; thickness 2 mm)

The samples S01 to S15 were each subjected to the processes of processes T170 to T190 of FIG. 2 to prepare the piezoelectric element 100 (FIG. 3). The piezoelectric element 100 of each sample was then measured for electrical characteristics (relative permittivity $\in_{33}^T/\in_0$), and piezoelectric characteristics (piezoelectric constant $d_{33}$ and electromechanical coupling coefficient kr). The results are presented in FIG. 7.

The samples S01 and S02 configured from only the second crystal phase did not have piezoelectric characteristics. These samples S01 and S02 had different values for the coefficient x in the composition formula of the second crystal phase, and there was no difference in the relative permittivity $\in_{33}^T/\in_0$. It is thus believed that the coefficient x in the composition formula of the second crystal phase has only small effects on the electrical characteristics and piezoelectric characteristics of the piezoelectric ceramic composition even in piezoelectric ceramic compositions that contain both the first crystal phase and the second crystal phase. In this respect, the coefficient x may have any value that can provide a stable, uniform crystal phase as the second crystal phase.

The samples S03 and S04 configured from only the first crystal phase had piezoelectric characteristics. These samples S03 and S04 are common in that neither of them contains element E (Ca, Sr, Ba). The difference lies in Li, which is contained in the sample S04 but not in the sample S03. The element D of the first crystal phase is Nb (niobium). The samples S03 and S04 do not differ greatly with regard to electrical characteristics (relative permittivity $\in_{33}^T/\in_0$) and piezoelectric characteristics (piezoelectric constant $d_{33}$ and electromechanical coupling coefficient kr). However, the sample S04 containing Li is more preferable because it has a slightly larger piezoelectric constant $d_{33}$ than the sample S03 containing no Li. Considering this, it is preferable that the first crystal phase contain Li even in piezoelectric ceramic compositions that contain both the first crystal phase and the second crystal phase.

The sample S05 is a composition that contains 5 mol % of the second crystal phase with the first crystal phase. The first crystal phase did not contain element E (Ca, Sr, Ba), and the coefficient x in the composition formula of the second crystal phase was zero. The sample S05 is equivalent to a combination of the samples S01 and S04. Compared to the characteristics of the sample S04 containing only the first crystal phase, the sample S05 had much greater values of relative permittivity $\in_{33}^{T}/\in_0$ and piezoelectric constant $d_{33}$, and its characteristics were preferable as a piezoelectric ceramic composition. The sample S05 was also superior to the sample S04 in terms of electromechanical coupling coefficient kr.

The samples S06 to S12 are compositions containing varying subphase contents of from 3 mol % to 20 mol %. The composition of the first crystal phase was $(K_{0.421}Na_{0.518}Li_{0.022}Ca_{0.039})_{1.07}NbO_{3.06}$ for the samples S06 to S12. The composition of the second crystal phase was $K_{0.85}Ti_{0.85}B_{1.15}O_5$ for the samples S06 to S12. The samples S06 to S12 were more preferable because they had sufficiently larger values of relative permittivity $\in_{33}^{T}/\in_0$ than the sample S04 of the Comparative Example. From the standpoint of relative permittivity, the subphase content preferably ranges from 3 to 10 mol %, further preferably 3 to 6 mol %.

The samples S06 to S11 were also more preferable for their sufficiently larger values of piezoelectric constant $d_{33}$ than that of the sample S04 of the Comparative Example. The sample S12 with the subphase content of 20 mol % is less preferable than the sample S04 of the Comparative Example for its smaller piezoelectric constant $d_{33}$.

Figure 8:
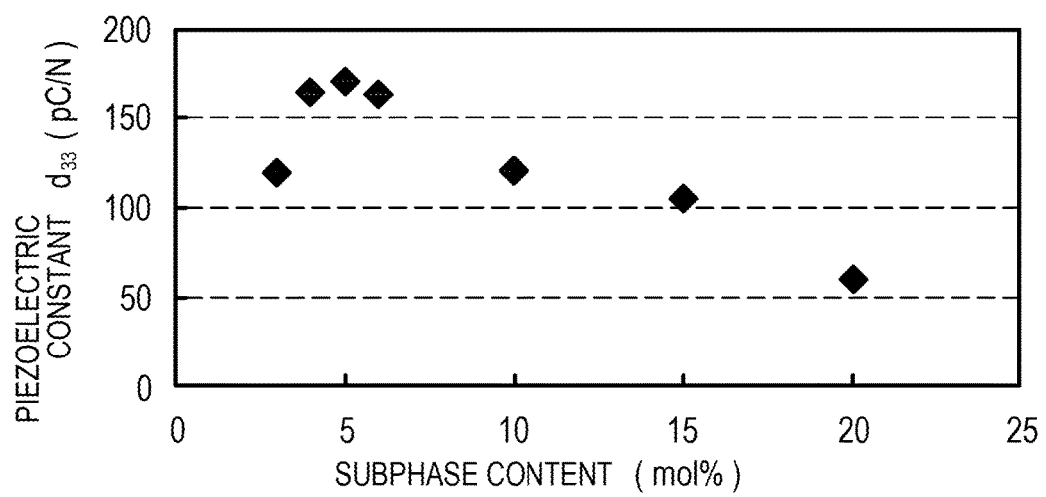
FIG. 8 is a graph representing the result of an experiment for the effect of subphase content on the voltage constant of the piezoelectric ceramic composition.

FIG. 8 is a graph representing the result of an experiment for the effect of subphase content on the voltage constant $d_{33}$ of the piezoelectric ceramic composition. FIG. 8 represents changes in piezoelectric constant $d_{33}$ for the samples S06 to S12. The horizontal axis represents subphase content, and the vertical axis represents piezoelectric constant $d_{33}$. As can be understood from the graph, the subphase content preferably ranges from 3 to 15 mol %, further preferably 3 to 10 mol %, most preferably 4 to 6 mol % from the standpoint of piezoelectric constant $d_{33}$.

The electromechanical coupling coefficients kr (FIG. 7) of the samples S06 to S11 are comparable to or better than that of the sample S04 of the Comparative Example, and all are preferable. The sample S12 with a subphase content of 20 mol % is less preferable than that of the sample S04 of the Comparative Example for its considerably smaller electromechanical coupling coefficient kr. From the standpoint of the electromechanical coupling coefficient, the subphase content preferably ranges from 3 to 10 mol %, further preferably 4 to 6 mol %.

The samples S05 and S08 are common in that the subphase content is 5 mol %. A significant difference, however, is that the first crystal phase of the sample S05 does not contain element E (Ca, Sr, Ba) at all, whereas the first crystal phase of the sample S08 contains Ca (calcium) as element E. The samples S05 and S08 have different values of coefficient x in the composition formula of the second crystal phase. However, as discussed in conjunction with the samples S01 and S02, the effect of the difference in the value of coefficient x on the characteristics of the piezoelectric ceramic composition is believed to be relatively small. By comparing the samples S05 and S08, the sample S08 containing Ca (calcium) in the first crystal phase is superior with respect to all of relative permittivity $\in_{33}^{T}/\in_0$, piezoelectric constant $d_{33}$, and electromechanical coupling coefficient kr. It is therefore preferable that the first crystal phase contain Ca as the component element E. Similarly, the same effect can be expected for other alkali earth elements (such as Sr and Ba) contained as component element E.

Note that the importance of relative permittivity $\in_{33}^{T}/\in_0$, piezoelectric constant $d_{33}$, and electromechanical coupling coefficient kr differs for different applications of the piezoelectric ceramic composition. For example, a composition with a large relative permittivity $\in_{33}^{T}/\in_0$ is suited for capacitors. A composition with a large piezoelectric constant $d_{33}$ is suited for actuators and sensors. A composition with a large electromechanical coupling coefficient kr is suited for piezoelectric transformers and actuators. Whether to use which piezoelectric ceramic composition is suitably determined according to the characteristics required of each different application.

The samples S13 and S14 in FIG. 7 were prepared to mainly examine the effect of the element B (Nb, Ta) of the second crystal phase. These samples are not much different with regard to relative permittivity $\in_{33}^{T}/\in_0$, piezoelectric constant $d_{33}$, and electromechanical coupling coefficient kr. It can thus be understood that Nb and Ta are both preferable as the element B.

The sample S14 has a composition similar to that of the sample S08. Namely, the compositions of these samples are essentially the same, the main difference being the amount Ca contained as the component element E of the first crystal phase, and accordingly the amounts of K and Na. By comparing the characteristics of these samples, the sample S14 containing more Ca is more preferable from the standpoint of relative permittivity $\in_{33}^{T}/\in_0$. However, the sample S08 containing less Ca is more preferable from the standpoint of piezoelectric constant $d_{33}$ and electromechanical coupling coefficient kr.

The sample S15 contains Ca and Sr in the same amounts (the same at %) as the component element E of the first crystal phase. The composition is otherwise similar to that of the sample S08. The sample S15 is not as desirable as the sample S08 in all of relative permittivity $\in_{33}^{T}/\in_0$, piezoelectric constant $d_{33}$, and electromechanical coupling coefficient kr. However, the sample S15 is more preferable than the sample S04 of the Comparative Example for its sufficiently large relative permittivity $\in_{33}^{T}/\in_0$ and piezoelectric constant $d_{33}$. As demonstrated above, a preferable composition can be obtained regardless of whether the alkali earth metal Ca or Sr is used as the component element E of the first crystal phase. It is thus expected that use of Ba instead of Ca or Sr (or in addition to Ca and Sr) would also provide similar characteristics. Note, however, that a piezoelectric ceramic composition of excellent characteristics can be provided at low cost when Ca is used as the component element E.

FIG. 9 is an explanatory view representing the results of experiments for the effect of subphase content and other variables on transition temperature. FIG. 9 presents the results for the samples S01 to S15 as in FIG. 7, and represents Curie points, and the results of an evaluation test for the presence or absence of phase transition at room temperature. The samples S05 to S15 have Curie points in a range of 300 to 350° C. Typically, the Curie point of the piezoelectric ceramic composition is sufficient when it is 300° C. or more. Therefore, samples S05 to S15 all have sufficiently high Curie points. The Curie point is mainly determined according to the characteristics of the first crystal phase, and thus it is believed that the Curie point of the whole piezoelectric ceramic composition does not fluctuate greatly even in the presence of slight changes in the subphase composition or subphase content. The samples S05 to S12 and the samples S14 to S15 using Nb as the component element B of the second crystal phase have higher Curie points than the sample S13 that uses Ta. Thus, as far as the Curie point is concerned, it is more preferable to use Nb, rather than Ta, as the component element B of the second crystal phase.

In the evaluation test for the presence or absence of phase transition at room temperature, the relative permittivity $\in_{33}^{T}/\in_0$ was measured while gradually varying the ambient temperature over a temperature range of −50° C. to +150° C. Typically, a piezoelectric ceramic composition that undergoes phase transition in a certain temperature range experiences abrupt changes in relative permittivity $\in_{33}^{T}/\in_0$, and shows a distinct peak according to temperature changes in this temperature range. On the other hand, no such distinct peak occurs in relative permittivity $\in_{33}^{T}/\in_0$, and changes are more gradual in a piezoelectric ceramic composition that does not undergo phase transition in such a temperature range. Thus, the samples S03 to S15 of FIG. 7 were measured to determine whether distinct phase transition could be observed from changes in relative permittivity $\in_{33}^{T}/\in_0$ while gradually varying the temperature over a temperature range of −50° C. to +150° C., and the presence or absence of phase transition at room temperature was determined. As used herein, "room temperature" means a temperature range wider than the common room temperature (25° C.), as can be understood from the context above.

Phase transition at room temperature was observed in the samples S03 and S04 of the Comparative Example. On the other hand, phase transition at room temperature was not observed in any of the samples S05 to S15. Phase transition at room temperature is not preferable, because it greatly changes the electrical characteristics and piezoelectric characteristics of the piezoelectric ceramic composition before and after the transition. From this standpoint, the samples S05 to S15 containing both the first crystal phase and the second crystal phase are more preferable than the samples S03 and S04 of the Comparative Example for the absence of phase transition at room temperature.

FIG. 10 is an explanatory view representing the results of experiments for the effect of coefficient e of the mother phase composition formula on the characteristics of the piezoelectric ceramic composition. FIG. 10 also presents the characteristics of the sample S04 as the Comparative Example. Samples S21 to S27 have the same values of coefficients a to d in the coefficients a to f of the composition formula of the first crystal phase, but have different values of coefficient e (the number of alkaline elements at A site). The alkali earth metal (element E in the composition formula) contained in the first crystal phase is Ca (calcium). The subphase contents are all 5 mol % in the samples S21 to S27. In the sample S21, the coefficient x in the composition formula of the second crystal phase is zero, whereas the coefficient x is 0.15 in other samples S22 to S27. However, as noted above, differences in coefficient x have only a small effect on characteristics. Note that the sample S25 is the same as the sample S14 presented in FIG. 7.

The samples S21 to S27 are more preferable than the sample S04 of the Comparative Example for their sufficiently larger values of relative permittivity $\in_{33}^{T}/\in_0$. From the standpoint of relative permittivity, the value of coefficient e in the composition formula of the first crystal phase preferably ranges from 0.97 to 1.1, further preferably 1.0 to 1.1. The samples S21 to S25 are more preferable than the sample S04 of the Comparative Example for their larger piezoelectric constants $d_{33}$. However, the samples S26 and S27 having coefficients e greater than 1.08 are less preferable than the sample S04 of the Comparative Example for their smaller piezoelectric constants $d_{33}$.

Figure 11:
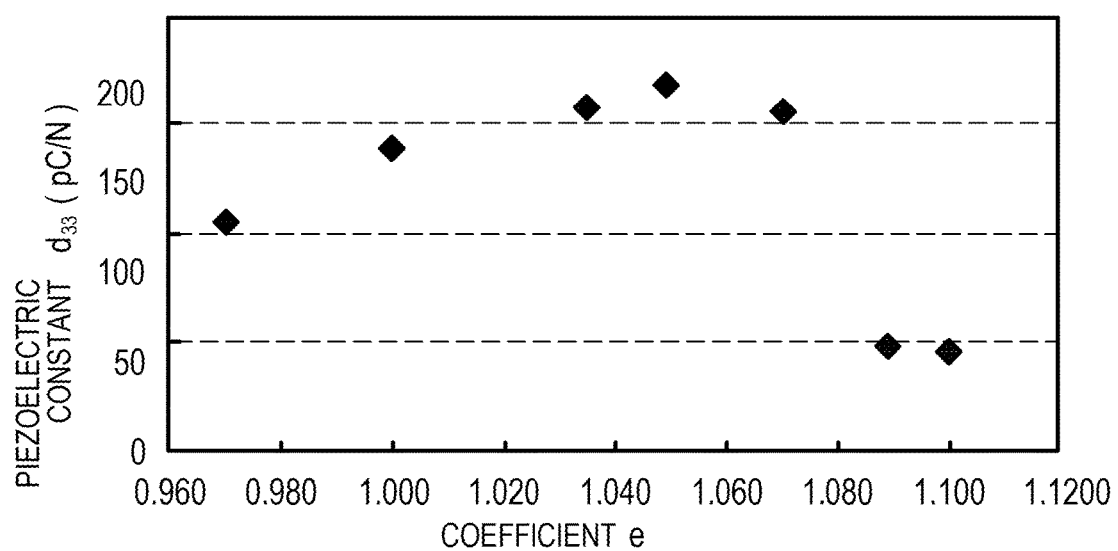
FIG. 11 is a graph representing the result of an experiment for the effect of the coefficient of the mother phase composition formula on the piezoelectric constant of the piezoelectric ceramic composition.

FIG. 11 is a graph representing the result of an experiment for the effect of coefficient e of the mother phase composition formula on the piezoelectric constant $d_{33}$ of the piezoelectric ceramic composition. FIG. 11 represents values of piezoelectric constant $d_{33}$ for the samples S21 to S27. The horizontal axis represents values of coefficient e in the composition formula of the first crystal phase. Note that the coefficient e represents the ratio of the sum of the number of atoms of the alkali metal element (K+Na+Li) and the alkali earth metal element (element E in the composition formula) to the number of Nb (niobium) atoms. As can be understood from the graph, the value of coefficient e in the composition formula of the first crystal phase preferably ranges from 0.97 to 1.08, further preferably 1.00 to 1.07 from the standpoint of piezoelectric constant $d_{33}$.

Referring to FIG. 10, the samples S26 and S27 are less preferable than the sample S04 of the Comparative Example for their smaller electromechanical coupling coefficients kr. The value of coefficient e in the composition formula of the first crystal phase preferably ranges from 0.97 to 1.08, further preferably 1.00 to 1.07 from the standpoint of electromechanical coupling coefficient.

FIG. 12 is an explanatory view representing the results of experiments for the effect of additional metals on the characteristics of the piezoelectric ceramic composition. FIG. 12 also presents the characteristics of the sample S04 as the Comparative Example. Sample S31 also represents a Comparative Example configured from only the first crystal phase, and contains 1 mol % of the additional metal Cu. The sample S31 has a smaller relative permittivity $\in_{33}^{T}/\in_0$ than the sample S04, but the electromechanical coupling coefficient kr is greater than that of the sample S04.

Samples S32 to S43 are compositions that contain 5 mol % of the second crystal phase. The coefficients a and b in the coefficients a to f in the composition formula of the first crystal phase differ for different samples, whereas the other coefficients c to f are essentially the same. The sample S32 is the same as the sample S08 presented in FIG. 7, and does not contain an additional metal.

As can be understood from the samples S33 to S43, a piezoelectric ceramic composition of sufficiently more desirable characteristics over the samples S04 and S31 of Comparative Example can be obtained when at least one metal element selected from Cu (copper), Ni (nickel), Co (cobalt), Fe (iron), Mn (manganese), Zr (zirconium), Ag (silver), Zn (zinc), Sc (scandium), and Bi (bismuth) is contained as the additional metal. Note that adding Cr (chromium) is also expected to provide the same characteristics as with the case of adding Mn (manganese). As can be understood from the comparison of the three the samples S32 to S34, the content of each additional metal is preferably less than 1 mol %. The total additional metal content is preferably 5 mol % or less. Containing additional metals in excess of these ranges is not preferable, because it may lower mainly the relative permittivity $\in_{33}^{T}/\in_0$ and the piezoelectric constant $d_{33}$.

FIG. 13 is an explanatory view representing the results of experiments for the effect of the presence or absence of subphase on the insulation of the piezoelectric ceramic composition. FIG. 13 represents the measured values of allowable voltage for the samples S03, S04, and S08 described with reference to FIG. 7, and for the sample S35 described with reference to FIG. 12. The term "allowable voltage" means the maximum voltage that can be applied to the piezoelectric element 100 of each sample without causing damage, such as cracking, in the piezoceramic 110. In the experiment represented in FIG. 13, voltage was applied for 30 min in an 80° C. environment, and the presence or absence of damage such as cracking in the piezoceramic 110 was examined. The allowable voltage can be regarded as an index of the insulation of the piezoelectric ceramic composition.

The samples S03 and S04 with no subphase had allowable voltages of 3 kV/mm, whereas the samples S08 and S35 containing 5 mol % of subphase had allowable voltages of 7 kV/mm and 9 kV/mm, respectively. It can be understood from these experiment results that the insulation of the piezoelectric ceramic composition can be improved by the presence of the structurally stable subphase (second crystal phase) contained with the first crystal phase.

FIG. 14 is an explanatory view representing the results of the qualitative analyses of the second crystal phase in the piezoelectric ceramic composition. The first four the samples S06, S08, S10, and S12 represent the piezoelectric ceramic compositions of the same sample numbers presented in FIG. 7. The samples S33, S35, S36, S40, and S42 represent the piezoelectric ceramic compositions of the same sample numbers presented in FIG. 12. For the analysis of the subphase (NTK phase), these nine samples were analyzed by XRD analysis (X-ray diffraction method), and TEM-EDS analysis (energy dispersive X-ray analysis using a transmission electron microscope). Note that the subphase composition, which is typically confirmed by using an X-ray diffraction method, may be confirmed by using techniques such as TEM-EDS when the amounts added or generated are small.

The last two columns at the right end of FIG. 14 represent the results of the qualitative analyses, in which "1115" means the 1115 phase ($KTiNbO_5$ phase), and "1319" the 1319 phase ($KTi_3NbO_9$ phase). As can be understood from the qualitative analysis results that the subphase of the piezoelectric ceramic composition is configured from the 1115 phase or 1319 phase alone, or from the 1115 phase and the 1319 phase together. It can be understood that the subphase is more likely to form the 1319 phase in the presence of the additional metal.

The samples described with reference to FIGS. 7 to 12, including the nine in FIG. 14 were all produced with a subphase material prepared as the 1115 phase in the producing process. Specifically, the subphase material was prepared as the 1115 phase in processes T130 and T140 of FIG. 2, and was mixed with the mother phase material in process T150, and fired in process T160 to produce each sample. It is thus believed that the 1319 phase in the subphase of each sample shown in FIG. 14 is the result of the conversion from the 115 phase during the firing process in process T160. As described with reference to FIGS. 7 and 12, the samples presented in FIG. 14 excelled in all of electrical characteristics (relative permittivity $\in_{33}^T/\in_0$) and piezoelectric characteristics (piezoelectric constant $d_{33}$ and electromechanical coupling coefficient kr). It is therefore possible to obtain a piezoelectric ceramic composition of excellent characteristics, regardless of whether the subphase after the firing is the 1115 phase or the 1319 phase.

FIG. 15 is an explanatory view representing the results of the qualitative analysis of the second crystal phase in the piezoelectric ceramic composition. The qualitative analysis results presented in FIG. 15 are those of the piezoelectric ceramic compositions prepared by mixing the mother phase material with the subphase material prepared as the 1319 phase. The subphase content is 3 mol % for sample S51, and is 5 mol % for the other samples S52 to S57. The samples S51 and S52 do not contain additional metals, whereas the other samples S53 to S57 contain additional metals such as Cu, Fe, Zn, and Mn. For the production of these samples, the subphase material prepared as the 1319 phase in processes T130 and T140 of FIG. 2 was mixed with the mother phase material in process T150, and fired in process T160. The qualitative analysis of the samples S51 to S57 revealed that the subphase was the 1319 phase in all samples. Further, the samples S51 to S57 had characteristic similar to the characteristics (see FIG. 12) of the samples S35 and S36 presented in FIG. 14, and excelled in all of electrical characteristics (relative permittivity $\in_{33}^T/\in_0$) and piezoelectric characteristics (piezoelectric constant $d_{33}$ and electromechanical coupling coefficient kr) (not presented in the figure).

FIG. 16 is an explanatory view representing the results of experiments for the effect of additional metals on the characteristics of the piezoelectric ceramic composition. FIG. 16 represents the results of the experiments conducted for samples S61 to S81 different from the samples S32 to S43 of FIG. 12. FIG. 16 also presents the characteristics of the samples S04 and S31 presented in FIG. 12 as a Comparative Example. Each sample was produced by using the second crystal phase prepared as the 1115 phase. Referring to FIG. 16, the samples S61 to S80 all contained the second crystal phase in 5 mol %, and the sample S81 did not contain the second crystal phase. All the samples S61 to S81 except for the samples S69, S72, and S76 each contained two of Ca, Sr, and Ba as the element E of the first crystal phase. These two elements are presented in the "Elements E1, E2" column under the heading "First Crystal Phase". The columns under "d1" and "d2" give coefficients for elements E1 and E2.

In the samples S61 to S81, the samples S80 and S81 were defective, as the compositions were not sufficiently densified by the firing in process T160 of FIG. 2. This is believed to be due to the excessively large value of coefficient e, 1.12, for the whole A site in the sample S80. It should be noted, however, that the sample S79 with the coefficient e of 1.09, and the sample S78 with the coefficient e of 0.98 both excelled in electrical characteristics (relative permittivity $\in_{33}^T/\in_0$) and piezoelectric characteristics (piezoelectric constant $d_{33}$ and electromechanical coupling coefficient kr). The results presented in FIG. 16, taken together, suggest that, with the additional metals, the coefficient e in the composition formula of the first crystal phase preferably ranges from 0.97 to 1.10, further preferably 1.00 to 1.09.

As can be understood from FIGS. 12 and 16, a piezoelectric ceramic composition of sufficiently more desirable characteristics over the samples S04 and S31 of the Comparative Example can be obtained when at least one of Cu (copper), Ni (nickel), Co (cobalt), Fe (iron), Mn (manganese), Zr (zirconium), Ag (silver), Zn (zinc), Sc (scandium), and Bi (bismuth) is contained as the additional metal. Adding Cr (chromium) is also expected to provide the same characteristics as with the case of adding Mn (manganese).

FIG. 17 is an explanatory view representing the results of the thermal cycle evaluation test for the piezoelectric ceramic composition. The thermal cycle evaluation test was conducted for the three samples S04, S31, S32 of FIG. 9, and for the eight samples S61 to S65, and S67 to S69 of FIG. 17. In the thermal cycle evaluation test, each sample was placed in a thermostatic chamber, and the piezoelectric characteristics at room temperature were evaluated (the "Initial value" column under the heading "Electromechanical coupling coefficient kr" in FIG. 17). Subsequently, a thermal cycle was repeated by increasing and decreasing the temperature at a rate of 2° C./min over −50° C., 150° C., 20° C., 150° C., and 20° C. The samples were held for 1 hour at each temperature. After the thermal cycle, the piezoelectric characteristics were reevaluated at room temperature (the "After thermal cycle" column under the heading "Electromechanical coupling coefficient kr" in FIG. 17).

As can be understood from the results presented in FIG. 17, the samples S04 and S31 containing no second crystal phase had large drop rates of approximately 70% in the electromechanical coupling coefficient kr after the thermal cycle. On the other hand, the drop rate of electromechanical coupling coefficient kr after the thermal cycle was sufficiently smaller, approximately 10% to approximately 26%, and was more desirable in the samples S32, S61 to S65, and S67 to S69 that contained the second crystal phase. As demonstrated above, the piezoelectric ceramic composition containing the second crystal phase does not undergo an abrupt characteristic drop after the thermal cycle, and is preferable for applications where excellent heat durability is required (including, for example, knock sensors, and combustion pressure sensors).

FIG. 18 is an explanatory view representing the results of experiments for the effect of subphase content on the characteristics of the piezoelectric ceramic composition. FIG. 18 represents the experiment results for the sample S68 of FIG. 16, and for the seven samples S90 to S96 of different subphase contents from the sample S68. Samples S90 to S96 were produced by using the same method used for the sample S68, except that the subphase material was mixed with the mother phase material in different proportions in process T150 of FIG. 2. In the experiments represented in FIG. 18, the samples were measured for porosity and dielectric breakdown voltage, in addition to electrical characteristics (relative permittivity $\in_{33}^T/\in_0$) and piezoelectric characteristics (piezoelectric constant $d_{33}$ and electromechanical coupling coefficient kr).

In the experiments represented in FIG. 18, the porosity of the samples was calculated by measuring the dry weight, the weight in water, and the wet weight of the sample. Weight in water and wet weight were measured as follows. After measuring the dry weight of the sample, the sample was completely immersed in water, and degassed in a vacuum to allow the sample to sufficiently absorb water. The weight of the sample immersed in water was then measured by using the Archimedes method to give the weight in water. Subsequently, the sample was taken out of water, and, after removing the excess water, the weight of the sample was measured to give the wet weight. The porosity of the sample was calculated according to the following equation (2), using the dry weight, the weight in water, and the wet weight.

Porosity[volume %]=(((wet weight)−(dry weight))/ ((wet weight)−(weight in water)))·100   (2)

Figure 19:
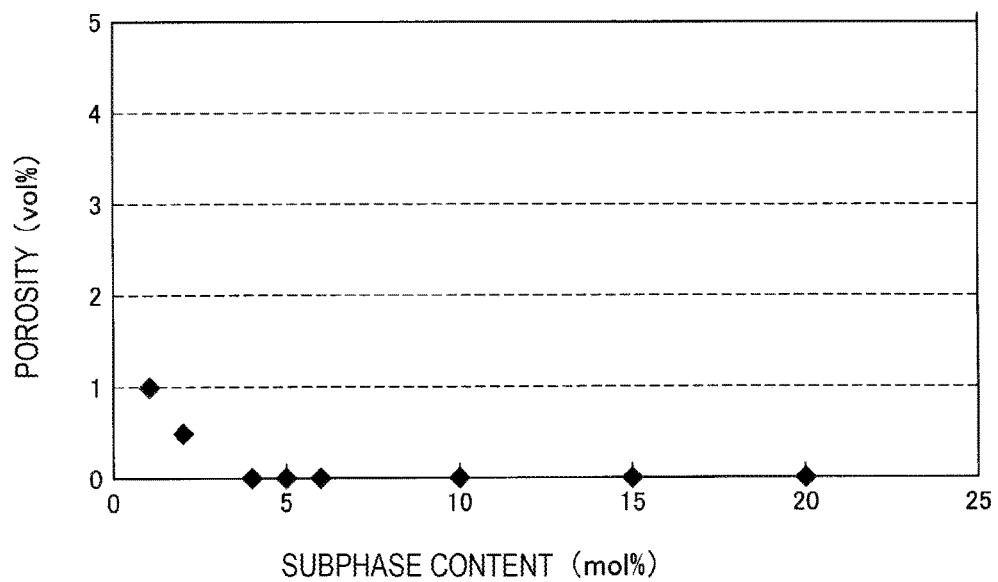
FIG. 19 is a graph representing the result of an experiment for the effect of subphase content on the porosity of the piezoelectric ceramic composition.

FIG. 19 is a graph representing the result of an experiment for the effect of subphase content on the porosity of the piezoelectric ceramic composition. FIG. 19 represents porosity changes for the samples S68, and S90 to S96. The horizontal axis represents subphase content, and the vertical axis represents porosity. As clearly represented in FIG. 19, the porosity was 1.0 volume % (Vol %) in the sample S90 that contained 1 mol % of the subphase content. The sample S91 with the subphase content of 2 mol % had a smaller porosity of 0.5 volume %. The porosity was even smaller, 0.0 volume %, in the samples that contained 4 to 20 mol % of the subphase content, showing that the pores were eliminated. The presence of pores in the piezoelectric ceramic composition is believed to lower the sinterability during the production, and the insulation of the piezoelectric ceramic composition. It is therefore preferable from the standpoint of porosity that the subphase content range from 2 to 20 mol %, further preferably 4 to 20 mol %.

Figure 20:
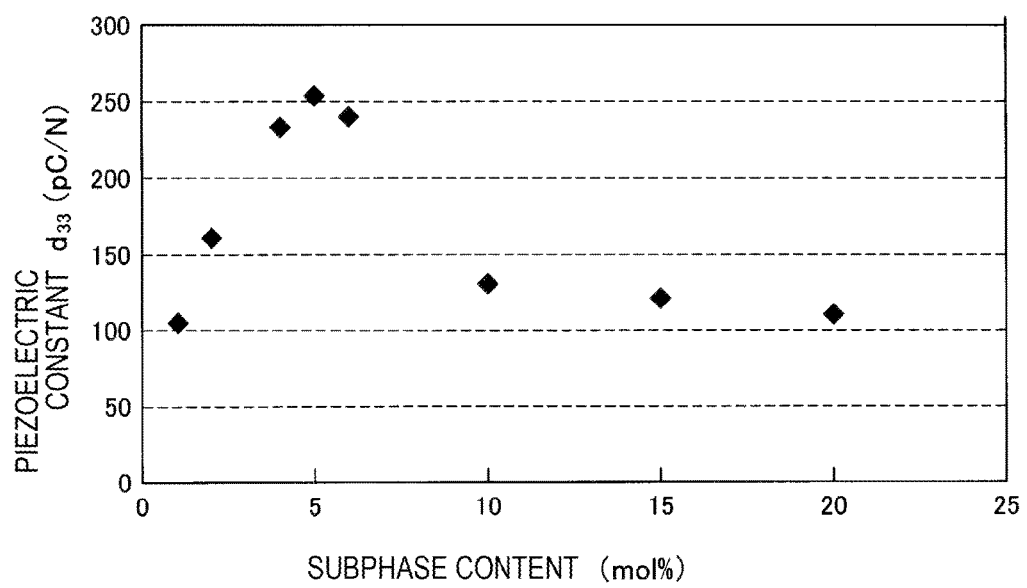
FIG. 20 is a graph representing the result of an experiment for the effect of subphase content on the voltage constant of the piezoelectric ceramic composition.

FIG. 20 is a graph representing the result of an experiment for the effect of subphase content on the voltage constant $d_{33}$ of the piezoelectric ceramic composition. FIG. 20 represents changes in piezoelectric constant $d_{33}$ for the samples S68, and S90 to S96. The horizontal axis represents subphase content, and the vertical axis represents piezoelectric constant $d_{33}$. As can be understood from the graph of FIG. 20, the samples with the subphase contents of 1 to 20 mol % desirably had piezoelectric constants $d_{33}$ of more than 100 pC/N. However, from the standpoint of piezoelectric constant $d_{33}$, the subphase content is preferably 2 to 10 mol %, further preferably 4 to 6 mol %, most preferably 5 mol %.

Figure 21:
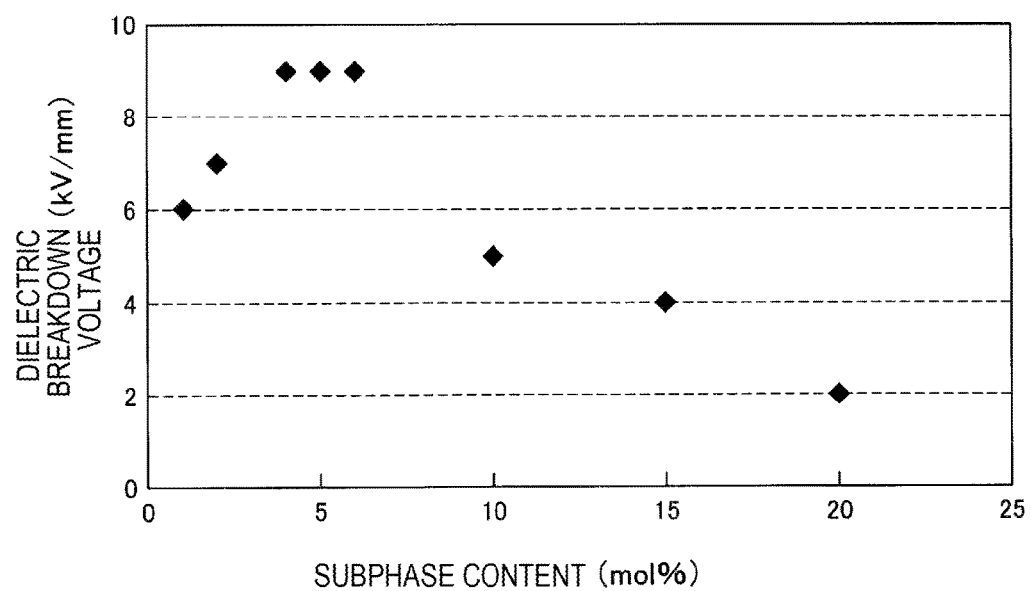
FIG. 21 is a graph representing the result of an experiment for the effect of subphase content on the dielectric breakdown voltage of the piezoelectric ceramic composition.

FIG. 21 is a graph representing the result of an experiment for the effect of subphase content on the dielectric breakdown voltage of the piezoelectric ceramic composition. FIG. 21 represents changes in dielectric breakdown voltage for the samples S68, and S90 to S96. The horizontal axis represents subphase content, and the vertical axis represents dielectric breakdown voltage. As can be understood from the graph of FIG. 21, the subphase content is preferably 1 to 15 mol %, further preferably 2 to 10 mol %, most preferably 4 to 6 mol % from the standpoint of dielectric breakdown voltage.

Figure 22:
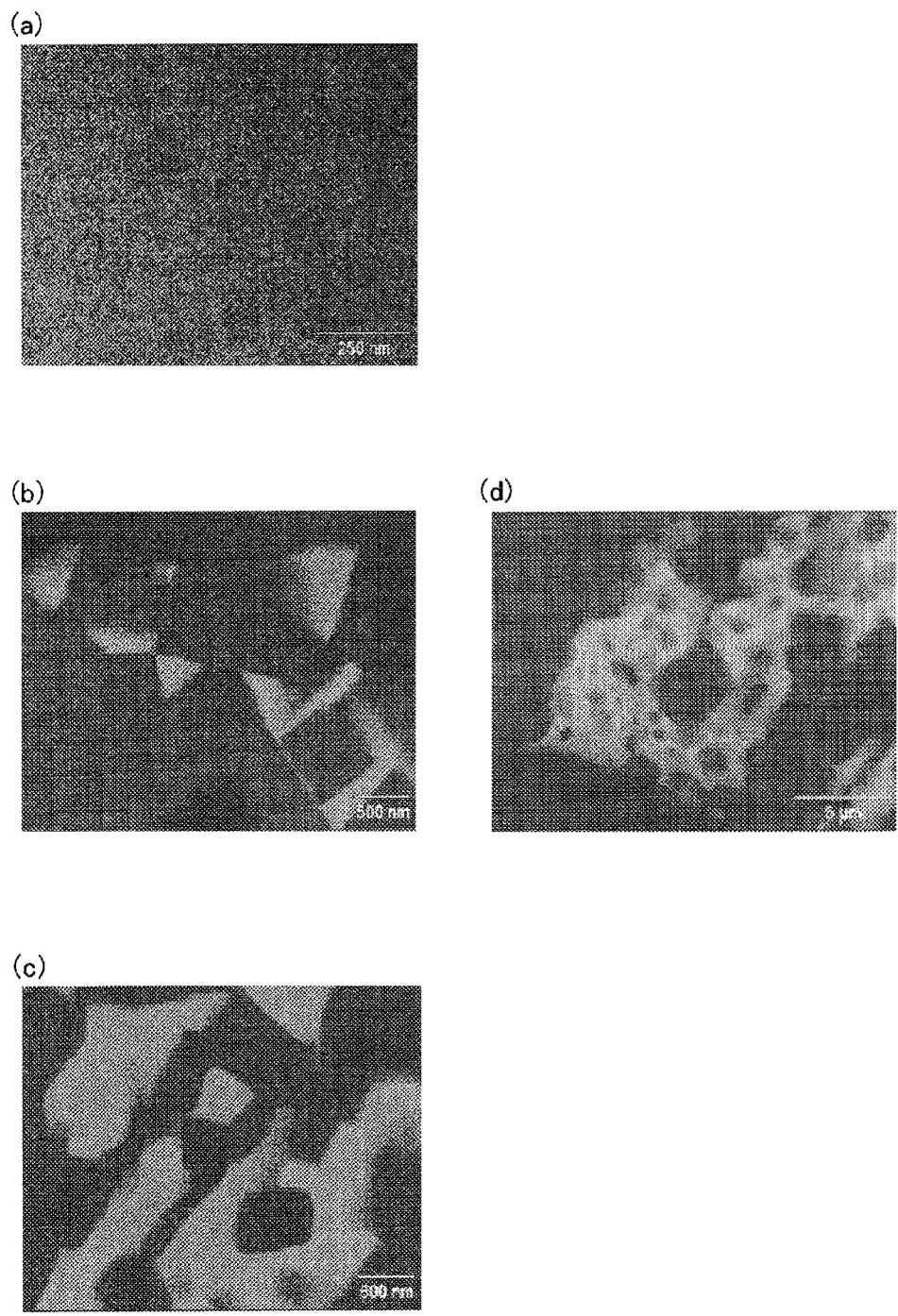
FIG. 22 is an explanatory view representing the effects of subphase content and producing method on the structure of the lead-free piezoelectric ceramic composition.

FIG. 22 is an explanatory view representing the effects of subphase content and producing method on the structure of the lead-free piezoelectric ceramic composition. The sample structures shown in FIG. 22 (a) to (b) are thin sections as observed under a transmission electron microscope (TEM-EDS) after dimpling and ion milling the lead-free piezoelectric ceramic composition. In FIG. 22, the black portion indicates the first crystal phase (mother phase, KNN phase), and the white portion indicates the second crystal phase (subphase, NTK phase).

FIG. 22 (a) shows a structure of the sample S90 (FIG. 18) having the subphase content of 1 mol %. The sample S90 was produced by using the two-phase control method (FIG. 2), and had a piezoelectric constant $d_{33}$ of 100 pC/N. As shown in FIG. 22 (a), the second crystal phase was finely dispersed in the first crystal phase in the structure with the 1 mol % subphase content, and no crystal grains were confirmed in the first crystal phase.

FIG. 22 (b) shows a structure of the sample S68 (FIGS. 17 and 18) having the subphase content of 5 mol %. The sample S68 was produced by using the two-phase control method (FIG. 2), and had a piezoelectric constant $d_{33}$ of 250 pC/N. As shown in FIG. 22 (b), a plurality of crystal grains was bound to each other in the deposited state in the first crystal phase in the structure with the 5 mol % subphase content, and the second crystal phase filled the spaces between the crystal grains in the first crystal phase.

FIG. 22 (c) shows a structure of the sample S94 (FIG. 18) having the subphase content of 10 mol %. The sample S94 was produced by using the two-phase control method (FIG. 2), and had a piezoelectric constant $d_{33}$ of 120 pC/N. As shown in FIG. 22 (c), a plurality of crystal grains was bound to each other in the deposited state in the first crystal phase in the structure with the 10 mol % subphase content, and the second crystal phase filled the spaces in the first crystal phase as in FIG. 22 (b). However, the crystal grain surfaces in the first crystal phase were smoother than in FIG. 22 (b), and the crystal grains in the first crystal phase were partially surrounded by the second crystal phase.

FIG. 22 (d) shows a structure of a sample that had the subphase content of 5 mol % and was prepared by using a method different from that used for the sample S68 shown in FIG. 22 (b). In the method used to produce the sample, unlike the two-phase control method (FIG. 2), the mother phase raw material and the subphase raw material were mixed with each other without being calcined, and molded and fired to produce the lead-free piezoelectric ceramic composition. Such a producing method is called a normal solid-phase method. The sample shown in FIG. 22 (d) had a piezoelectric constant $d_{33}$ of 160 pC/N. As shown in FIG. 22 (d), a plurality of crystal grains in the first crystal phase was surrounded by the second crystal phase as expected in structures formed by the normal solid-phase method, and the structure was different from that produced by using the two-phase control method (FIG. 22 (b)).

As can be understood from FIG. 22 (a) to (d), it is preferable from the standpoint of piezoelectric constant $d_{33}$ that the lead-free piezoelectric ceramic composition structure be formed of mainly the first crystal phase in which a plurality of crystal grains is bound to each other in the deposited state, and the second crystal phase that fills the spaces between the crystal grains in the first crystal phase. Further, from the standpoint of obtaining a structure having excellent piezoelectric characteristics, the lead-free piezoelectric ceramic composition is preferably produced by using the two-phase control method, rather than the normal solid-phase method.

Figure 23:
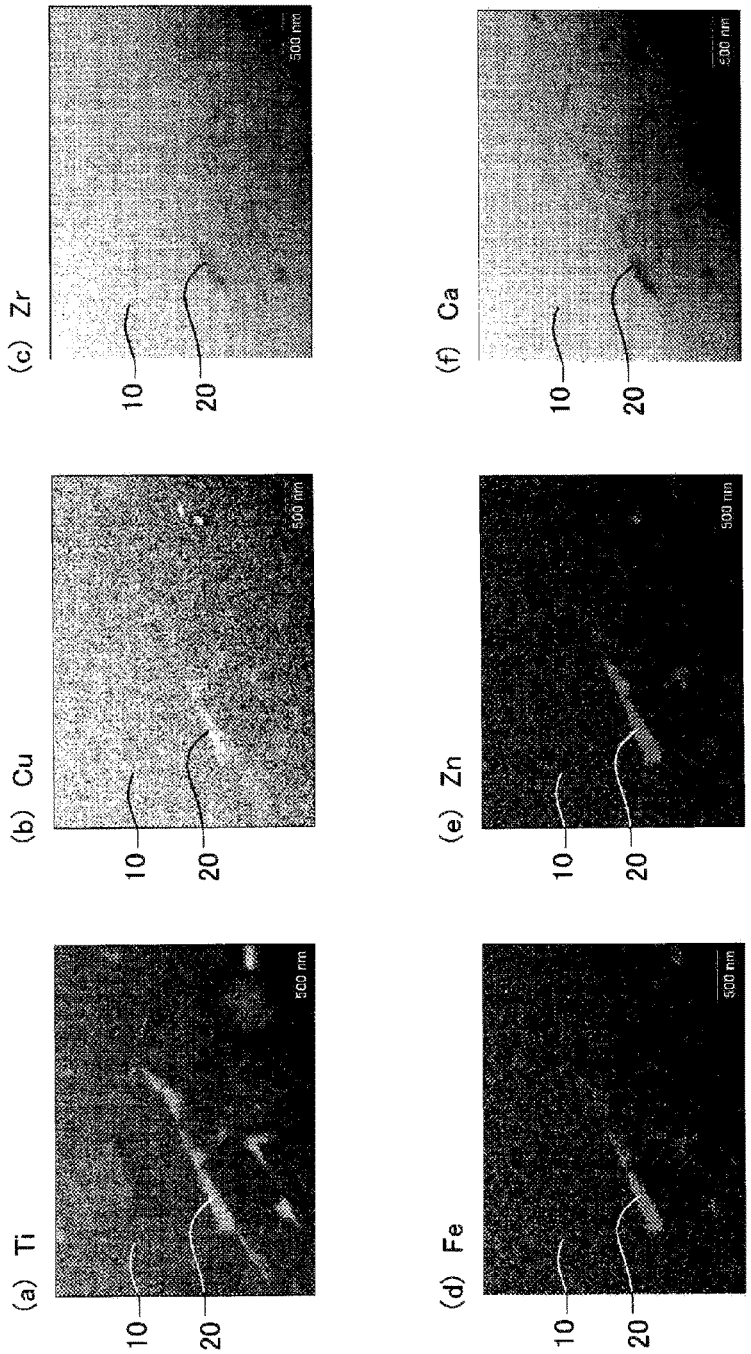
FIG. 23 is an explanatory view showing distributions of trace elements in the piezoelectric ceramic composition.

FIG. 23 is an explanatory view showing distributions of trace elements in the piezoelectric ceramic composition. The images in FIG. 23 (a) to (f) represent distributions of each trace element of the sample S68 (FIGS. 17 and 18), shown as a sample thin section as observed under a transmission electron microscope (TEM-EDS) after dimpling and ion milling the lead-free piezoelectric ceramic composition. FIG. 23 (a) to (f) represents distributions of the trace elements Ti (titanium), Cu (copper), Zr (zirconium), Fe (iron), Zn (zinc), and calcium (Ca). In FIG. 23 (a) to (f), brighter portions contain more trace element of interest, and darker portions hardly contain a trace element of interest. The images shown in FIG. 23 (a) to (f) were obtained by taking the same portion of the sample S68. As can be understood from FIGS. 23 (a), (b), (d) and (e), the trace elements Ti, Cu, Fe, Zn are localized in the second crystal phase (subphase, NTK phase) 20. As can be understood from FIGS. 23 (c) and (f), the trace elements Zr and Ca are localized in the first crystal phase (mother phase, KNN phase) 10. As demonstrated above, the trace elements localized in the first crystal phase 10 and the second crystal phase 20 are believed to have effects on the piezoelectric characteristics of the lead-free piezoelectric ceramic composition.

FIG. 25 is an explanatory view representing the results of experiments for the characteristics of the piezoelectric ceramic composition. FIG. 25 represents the results of the experiments conducted for the sample S04 and samples S101 to S114. The experiments were conducted with respect to the relative permittivity $\in_{33}^{T}/\in_{0}$, the compliance $S_{33}^{E}$, the piezoelectric constant $d_{33}$, and the electromechanical coupling coefficient kr of each sample, as shown in FIG. 25.

The samples S101 to S114 in FIG. 25 contain Ca as the element E1 of the first crystal phase, Ba as the element E2 of the first crystal phase, and the 1115 phase as the second crystal phase. The samples S101 to S114 in FIG. 24 contain additional metals, for which at least two metal elements are selected from Cu (copper), Co (cobalt), Fe (iron), Zr (zirconium), Zn (zinc), and Co.

The samples S04 and S101 were produced by using the first producing method of FIG. 2 after the firing of the mixture of the mother phase calcined product and the subphase calcined product, without calcining the mixture. The samples S102 to S114 were produced by using the second producing method of FIG. 24 after calcining (process T254) and firing the mixture of the mother phase calcined product and the subphase calcined product.

From the experiment results presented in FIG. 24 and the comparison of the sample S04 containing no second crystal phase and the samples S101 to S114 containing the second crystal phase, it is believed that the presence of the second crystal layer in the piezoelectric ceramic composition improves not only relative permittivity $\in_{33}^{T}/\in_{0}$ and electromechanical coupling coefficient kr, but compliance $S_{33}^{E}$ and, in turn, piezoelectric constant $d_{33}$. Note that the piezoelectric constant $d_{33}$ can be represented by the following equation (3).

[Mathematical Formula 1]

$$d_{33}=k_{33}\sqrt{\in_{33}^{T}\cdot S_{33}^{E}} \qquad (3)$$

It was also found from the experiment results presented in FIG. 24 that the piezoelectric ceramic compositions containing at least two of the metal elements Cu (copper), Co (cobalt), Fe (iron), Zr (zirconium), Zn (zinc), and Co (cobalt) as the additional metals can have more desirable characteristics than the sample S04 of the Comparative Example.

Further, by comparing the samples S101 and 104 that have essentially the same composition but differ in the presence or absence of calcining (process T254), it can be seen that the sample S104 produced with calcining (process T254) was superior in all characteristics to the sample S101 produced without calcining (process T254).

Figure 26:
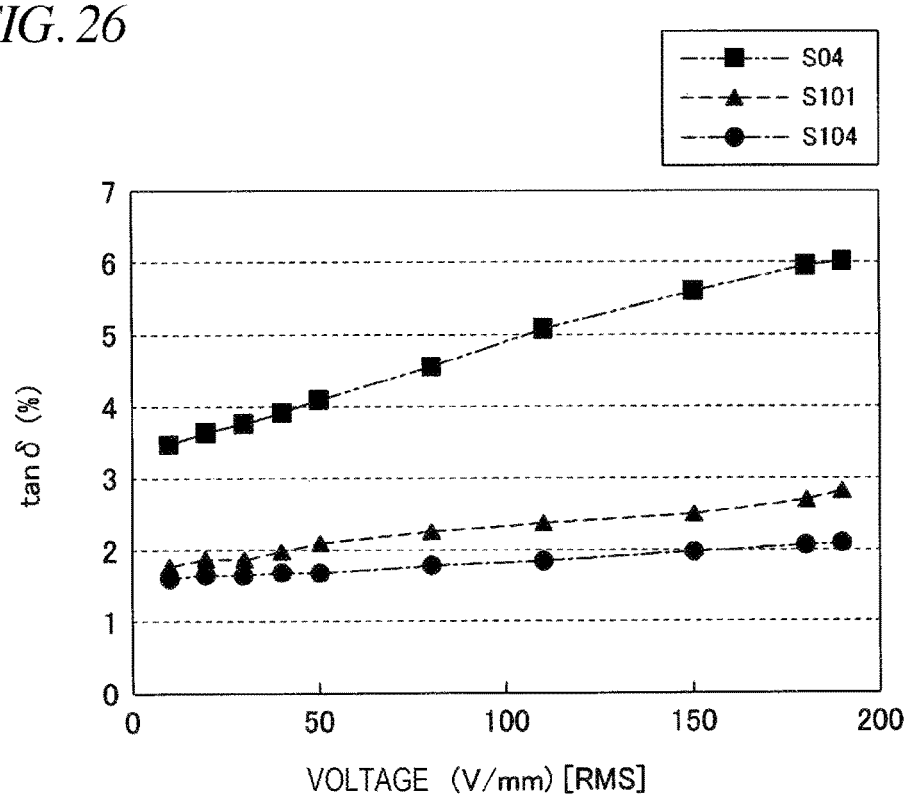
FIG. 26 is an explanatory view representing the result of an experiment for the characteristics of the piezoelectric ceramic composition.

FIG. 26 is an explanatory view representing the result of an experiment for the characteristics of the piezoelectric ceramic composition. The evaluation experiment was conducted for each of the samples S04, S101, and S104 by measuring the dissipation tan δ, indicative of a dielectric loss, upon application of alternating voltage according to the European Standard BS EN 50324-3:2002. The experiment result for each sample is plotted in FIG. 26, in which the horizontal axis represents voltage, and the vertical axis represents dissipation tan δ.

It can be seen from the experiment results of FIG. 26 that the dissipation tan δ is smaller (namely, a smaller dielectric loss) in the samples S101 and S104 than in the sample S04 of the Comparative Example in any voltage range.

Further, by comparing the samples S101 and 104 that have essentially the same composition but differ in the presence or absence of calcining (process T254), it can be seen that the dissipation tan δ is smaller (namely, a smaller dielectric loss) in any voltage range in the sample S104 produced with calcining (process T254) than in the sample S101 produced without calcining (process T254). It can also be seen that the difference in dissipation tan δ between the samples S101 and 104 increases with voltage increase. Thus, it can be seen that the piezoelectric ceramic composition produced with calcining (process T254) is superior to the piezoelectric ceramic composition produced without calcining (process T254) in terms of electric field characteristics, and is more useful particularly in transducer applications that involve application of an electric field for driving.

Figure 27:
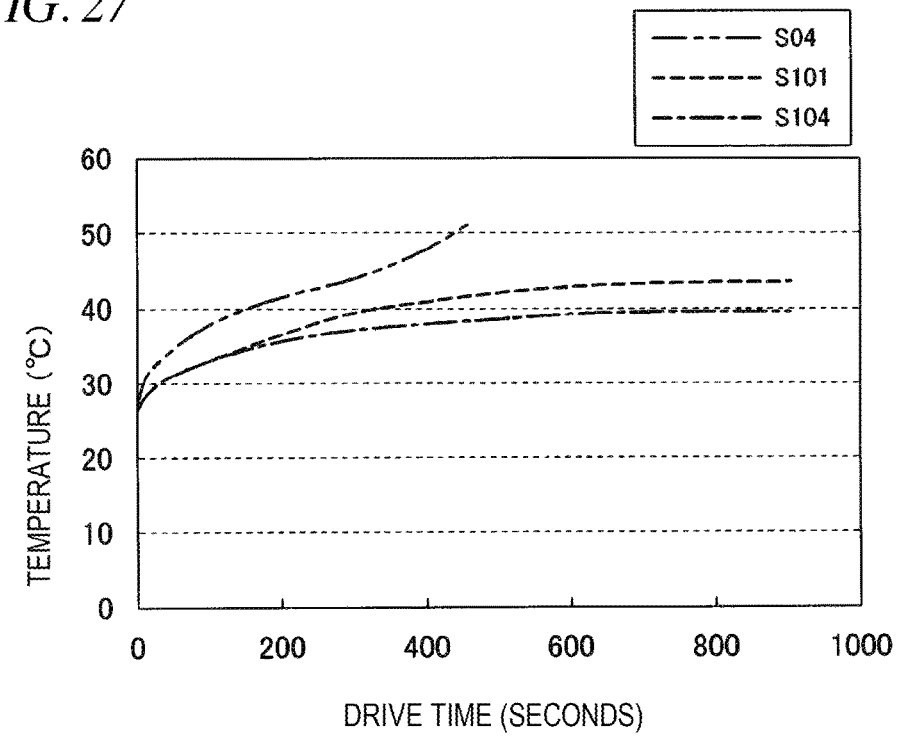
FIG. 27 is an explanatory view representing the result of an experiment for the dynamic characteristics of a transducer.

FIG. 27 is an explanatory view representing the result of an experiment for the dynamic characteristics of a transducer. Referring to FIG. 27, the evaluation experiment was conducted for a transducer produced from each of the sample S04, S101, and S104, and by measuring the temperature of the transducer being driven at an amplitude of 15 μm (micrometers), a vibration rate of 700 mm/s, and an input electric power of 10 W (watt). The result of the experiment for each sample is plotted as shown in FIG. 27, in which the horizontal axis represents drive time, and the vertical axis represents transducer temperature.

As shown in FIG. 27, the transducer using the sample S04 underwent an abrupt temperature increase after 400 seconds of drive time, and failed to sustain its operation. On the other hand, the transducers using the samples S101 and S104 underwent a gradual temperature increase after the start of the driving, and stabilized after 600 seconds of drive time, making it possible to stably sustain the driving of the transducers. Particularly, it can be seen that the temperature increase in the transducer using the sample S104 produced with calcining (process T254) is smaller than that in the transducer using the sample S101 produced without calcining (process T254).

Figure 28:
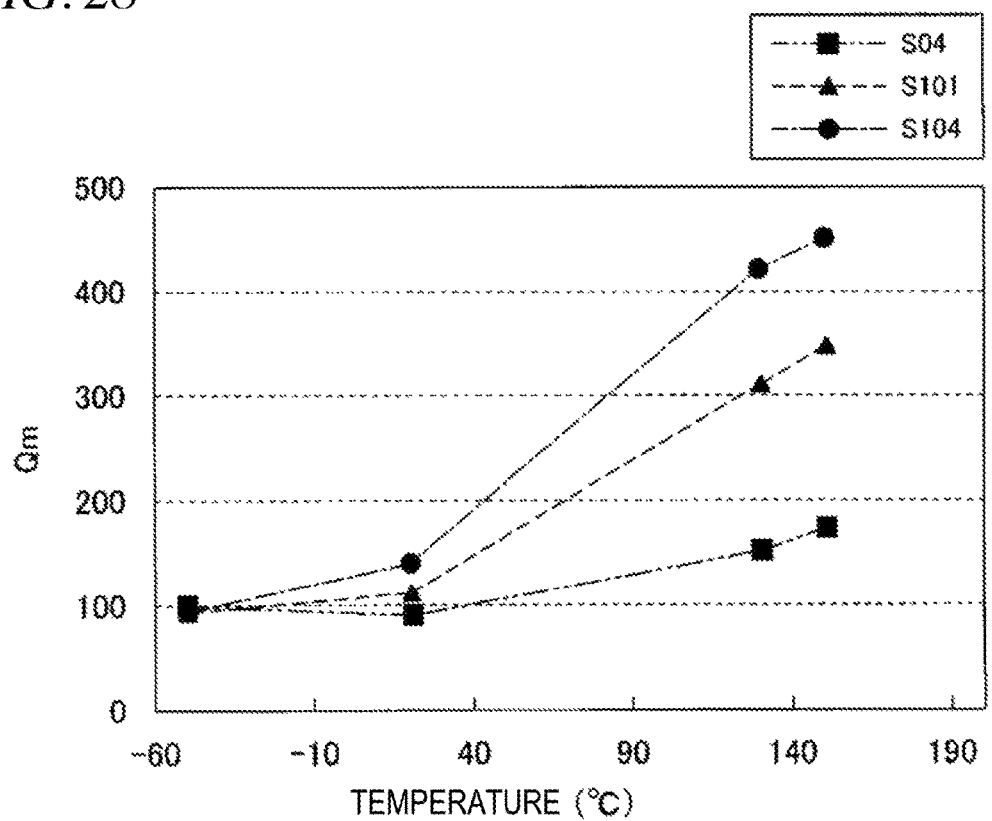
FIG. 28 is an explanatory view representing the result of an experiment for the static characteristic of a transducer.

FIG. 28 is an explanatory view representing the result of an experiment for the static characteristic of a transducer. Referring to FIG. 28, the evaluation experiment was conducted for a transducer produced from each of the samples S04, S101, S104 as in the evaluation experiment of FIG. 27, and by measuring the mechanical quality coefficient Qm under varying transducer temperatures. Larger mechanical quality coefficients Qm mean smaller losses. The experiment result for each sample is represented in FIG. 28, in which the horizontal axis represents transducer temperature, and the vertical axis represents mechanical quality coefficient Qm.

As can be seen from FIG. 28 that the loss becomes smaller with temperature increase in the transducers using the samples S101 and S104 than in the transducer using the sample S04. Particularly, it can be seen that the loss becomes even smaller with temperature increase in the transducer using the sample S104 produced with calcining (process T254) than in the transducer using the sample S101 produced without calcining (process T254). It is therefore believed that, as shown in the experiment results presented in FIG. 27, the temperature increase during continuous use can be suppressed in the transducers using the samples S101 and S104, but not in the transducer using the sample S04.

The present invention is not limited to the embodiments, examples, and variations described above, and can be realized in various configurations, provided that such changes do not depart from the gist of the present invention. For example, the technical features in the embodiments, examples, and variations corresponding to the technical features in the configurations described in the Summary of the Invention section can be appropriately replaced or combined to solve some of or all of the foregoing problems, or to achieve some of or all of the foregoing effects. Further, such technical features may be appropriately deleted if not described as being essential in the description of the present invention.

DESCRIPTION OF REFERENCE NUMERALS AND SIGNS

10 First crystal phase (mother phase, KNN phase)
20 Second crystal phase (subphase, NTK phase)
100 Piezoelectric element
110 Piezoceramic
120 Electrode
200 Sensing device
210 Metal shell
210a Through hole
210b Screw threads
210c, 210d groove
212 Tube
214 Seating portion
220 Insulating sleeve
230 Insulating plate
240 Piezoelectric element
242 Thin plate electrode
244 Piezoceramic
246 Thin plate electrode
250 Insulating plate
260 Characteristic adjusting weight
270 Washer
280 Nut
290 Housing
300 Ultrasonic drive device
310 Piezoelectric element pair
312 Piezoelectric element
313 Electrode plate
314 Piezoelectric element
315 Electrode plate
320 Front panel
322 Conical portion
328 Ultrasonic radiation surface
330 Backing panel
332 Conical portion
338 Blind end hole
340 Center bolt
400 Ultrasonic processing machine
410 Base
420 Piezoelectric element
430 Grinding stone portion
440 Spindle
450 Jig

The invention claimed is:

1. A lead-free piezoelectric ceramic composition mainly comprising:
    a first crystal phase in which a plurality of crystal grains formed of an alkali niobate/tantalate perovskite oxide having piezoelectric characteristics is bound to each other in a deposited state;
    a second crystal phase formed of a compound containing titanium (Ti) and filling spaces between the plurality of crystal grains of the first crystal phase; and
    at least one metal element selected from copper (Cu), iron (Fe), and zinc (Zn), which is contained by being localized more in the second crystal phase than in the first crystal phase;
    wherein the lead-free piezoelectric ceramic composition is produced by mixing a mother phase calcined product and a subphase calcined product, and calcining the mixed mother phase calcined product and the subphase calcined product.

2. The lead-free piezoelectric ceramic composition according to claim 1,
    wherein the second crystal phase is contained in a content of 2 to 10 mol %.

3. The lead-free piezoelectric ceramic composition according to claim 1, further comprising metal element cobalt (Co), which is contained by being localized more in the second crystal phase than in the first crystal phase.

4. The lead-free piezoelectric ceramic composition according to claim 1, further comprising at least one metal element selected from zirconium (Zr) and calcium (Ca), which is contained by being localized more in the first crystal phase than in the second crystal phase.

5. The lead-free piezoelectric ceramic composition according to claim 1,
wherein the compound forming the second crystal phase is an A-Ti—B—O composite compound (wherein the element A is an alkali metal, the element B is at least one of niobium (Nb) and tantalum (Ta), and each of the contents of the element A, the element B, and titanium (Ti) is not zero).

6. The lead-free piezoelectric ceramic composition according to claim 5,
wherein the element A is potassium (K).

7. The lead-free piezoelectric ceramic composition according to claim 5,
wherein the element B is niobium (Nb).

8. The lead-free piezoelectric ceramic composition according to claim 1,
wherein the compound forming the second crystal phase has a lower melting point than the alkali niobate/tantalate perovskite oxide forming the first crystal phase.

9. The lead-free piezoelectric ceramic composition according to claim 1, produced by mixing, molding, and firing a crystal powder formed of an alkali niobate/tantalate perovskite oxide having piezoelectric characteristics and a crystal powder formed of a compound that contains titanium (Ti).

10. A piezoelectric element comprising:
a piezoceramic formed from the lead-free piezoelectric ceramic composition according to claim 1; and
an electrode mounted on the piezoceramic.

11. An ultrasonic processing machine comprising the piezoelectric element of claim 10.

12. An ultrasonic drive device comprising the piezoelectric element of claim 10.

13. A sensing device comprising the piezoelectric element of claim 10.

14. A method for producing a lead-free piezoelectric ceramic composition, the method comprising:
calcining to obtain a mother phase calcined product formed of an alkali perovskite oxide containing at least one of niobium and tantalum having piezoelectric characteristics;
calcining to obtain a subphase calcined product being formed of a compound that contains titanium (Ti);
mixing the mother phase calcined product and the subphase calcined product;
calcining the mixed mother phase calcined product and the subphase calcined product at a first temperature after the mixing;
producing a molded product by mixing and molding the calcined mixed mother phase calcined product and the subphase calcined product at the first temperature; and
producing a lead-free piezoelectric ceramic composition, in which a first crystal phase is formed by binding a plurality of crystal grains of the first crystal powder in a deposited state and a second crystal phase is formed by melting the second crystal powder to fill spaces between the plurality of crystal grains of the first crystal phase, by firing the molded product at a second temperature higher than the first temperature.

* * * * *